(12) United States Patent
Zhou et al.

(10) Patent No.: US 9,653,617 B2
(45) Date of Patent: May 16, 2017

(54) MULTIPLE JUNCTION THIN FILM TRANSISTOR

(71) Applicant: SanDisk 3D LLC, Milpitas, CA (US)

(72) Inventors: Guangle Zhou, San Jose, CA (US); Ming-Che Wu, San Jose, CA (US); Yung-Tin Chen, Santa Clara, CA (US)

(73) Assignee: SanDisk Technologies LLC, Plano, TX (US)

( * ) Notice: Subject to any disclaimer, the term of this patent is extended or adjusted under 35 U.S.C. 154(b) by 10 days.

(21) Appl. No.: 14/723,038

(22) Filed: May 27, 2015

(65) Prior Publication Data
US 2016/0351722 A1    Dec. 1, 2016

(51) Int. Cl.
| H01L 29/786 | (2006.01) |
|---|---|
| H01L 27/24 | (2006.01) |
| H01L 29/423 | (2006.01) |
| H01L 29/66 | (2006.01) |
| H01L 21/265 | (2006.01) |
| H01L 45/00 | (2006.01) |

(52) U.S. Cl.
CPC .... *H01L 29/78696* (2013.01); *H01L 21/2652* (2013.01); *H01L 27/249* (2013.01); *H01L 27/2454* (2013.01); *H01L 29/42392* (2013.01); *H01L 29/66742* (2013.01); *H01L 29/78642* (2013.01); *H01L 45/16* (2013.01); *H01L 21/26513* (2013.01)

(58) Field of Classification Search
CPC .......... H01L 29/78618; H01L 27/2454; H01L 29/66666; H01L 29/66742; H01L 29/78642; H01L 29/78696; H01L 29/7424; H01L 29/1095; H01L 29/0661; H01L 21/823807; H01L 29/105
See application file for complete search history.

(56) References Cited

U.S. PATENT DOCUMENTS

| 4,024,564 A | 5/1977 | Shimada et al. |
|---|---|---|
| 4,405,932 A * | 9/1983 | Ishii ................ H01L 29/866 257/497 |
| 5,880,511 A | 3/1999 | Yu et al. |

(Continued)

OTHER PUBLICATIONS

Zhao, Shuyun, et al., "Bridged-Grain Polycrystalline Silicon Thin-Film Transistors," IEEE Transactions on Electron Devices, vol. 60, No. 6, Jun. 2013, 6 pages.

*Primary Examiner* — Matthew Reames
*Assistant Examiner* — John Bodnar
(74) *Attorney, Agent, or Firm* — Vierra Magen Marcus LLP

(57) ABSTRACT

A multiple junction thin film transistor (TFT) is disclosed. The body of the TFT may have an n+ layer residing in a p− region of the body. The TFT may have an n+ source and an n+ drain on either side of the p− region of the body. Thus, the TFT has an n+/p−/n+/p−/n+ structure in this example. The n+ layer in the p− region increases the breakdown voltage. Also, drive current is increased. The impurity concentration in the n+ layer in the p− body and/or thickness of the n+ layer in the p− body may be tuned to increase performance of the TFT. In an alternative, the body of the TFT has a p+ layer residing in an n− region of the body. The TFT may have a p+ source and a p+ drain on either side of the p− region of the body.

19 Claims, 29 Drawing Sheets

(56) References Cited

U.S. PATENT DOCUMENTS

| | | | |
|---|---|---|---|
| 5,891,782 A | 4/1999 | Hsu et al. | |
| 6,118,155 A | 9/2000 | Voldman | |
| 6,376,897 B2 | 4/2002 | Yamada et al. | |
| 6,384,431 B1 | 5/2002 | Takahashi et al. | |
| 8,274,130 B2 | 9/2012 | Mihnea et al. | |
| 8,288,839 B2 | 10/2012 | Guan et al. | |
| 8,426,865 B2 | 4/2013 | Kwok et al. | |
| 8,557,654 B2 | 10/2013 | Rabkin et al. | |
| 9,001,580 B1* | 4/2015 | Horch | H01L 27/11521 365/149 |
| 2004/0126940 A1 | 7/2004 | Inoue | |
| 2008/0192395 A1 | 8/2008 | Albers et al. | |
| 2008/0315260 A1 | 12/2008 | Duane | |
| 2009/0067246 A1* | 3/2009 | Walker | G11C 16/0408 365/185.17 |
| 2011/0266593 A1 | 11/2011 | Hsieh | |
| 2012/0199906 A1* | 8/2012 | Clark, Jr. | H01L 29/42384 257/347 |
| 2013/0273700 A1* | 10/2013 | Rabkin | H01L 29/6675 438/158 |
| 2015/0255511 A1* | 9/2015 | Takagi | H01L 45/08 365/63 |

\* cited by examiner

Programming

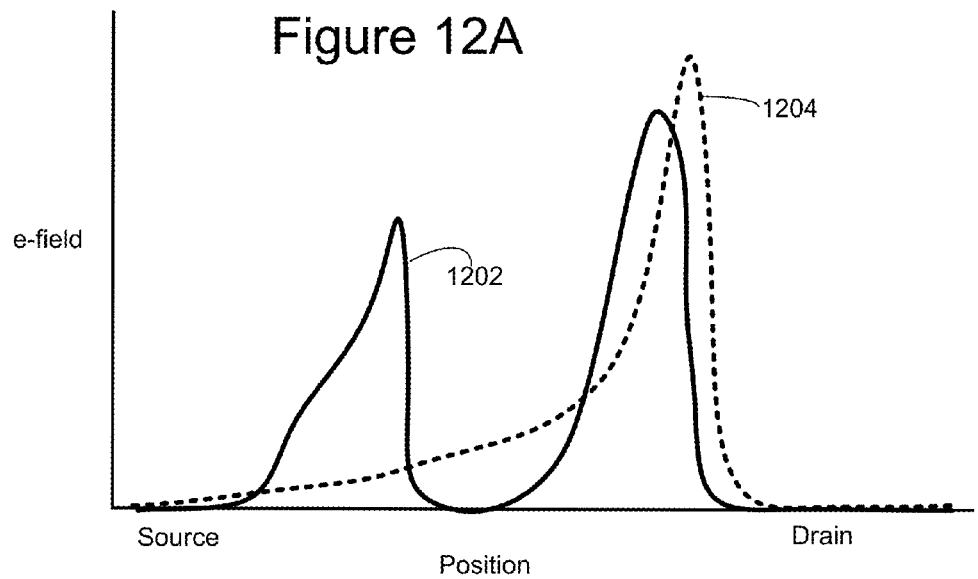
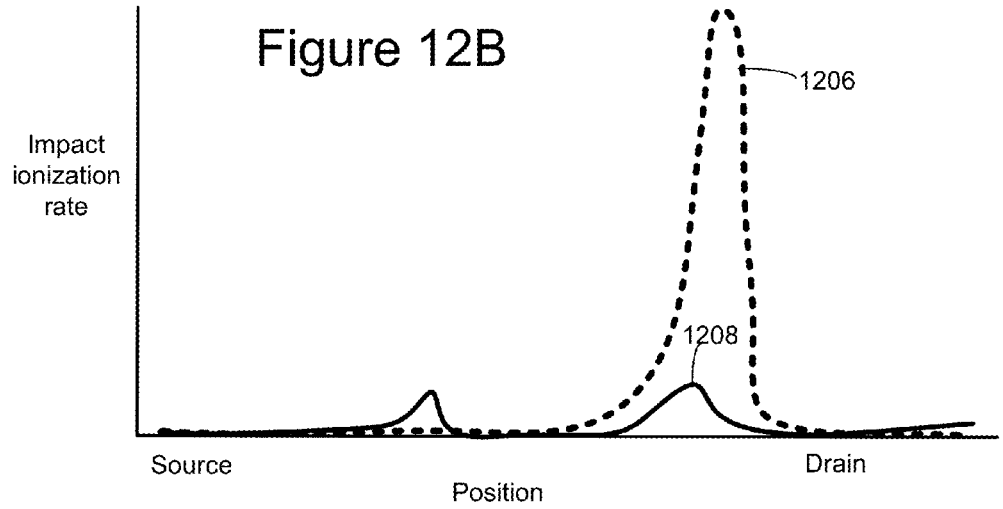

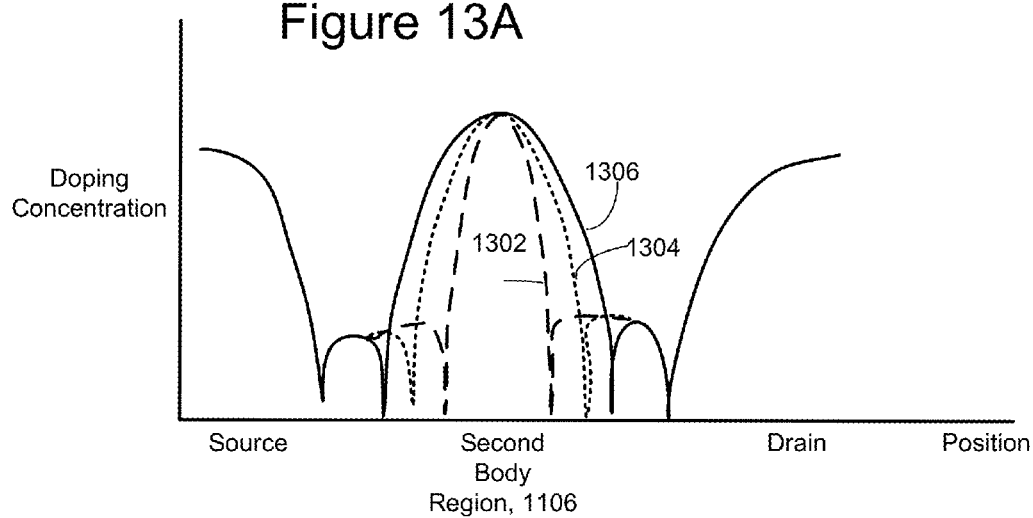
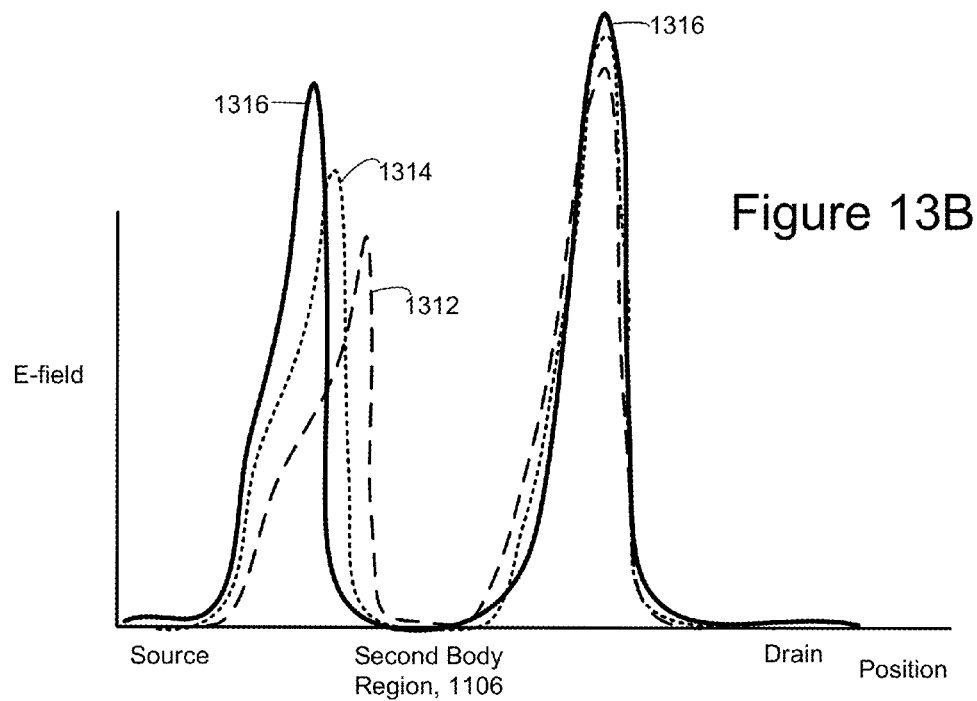

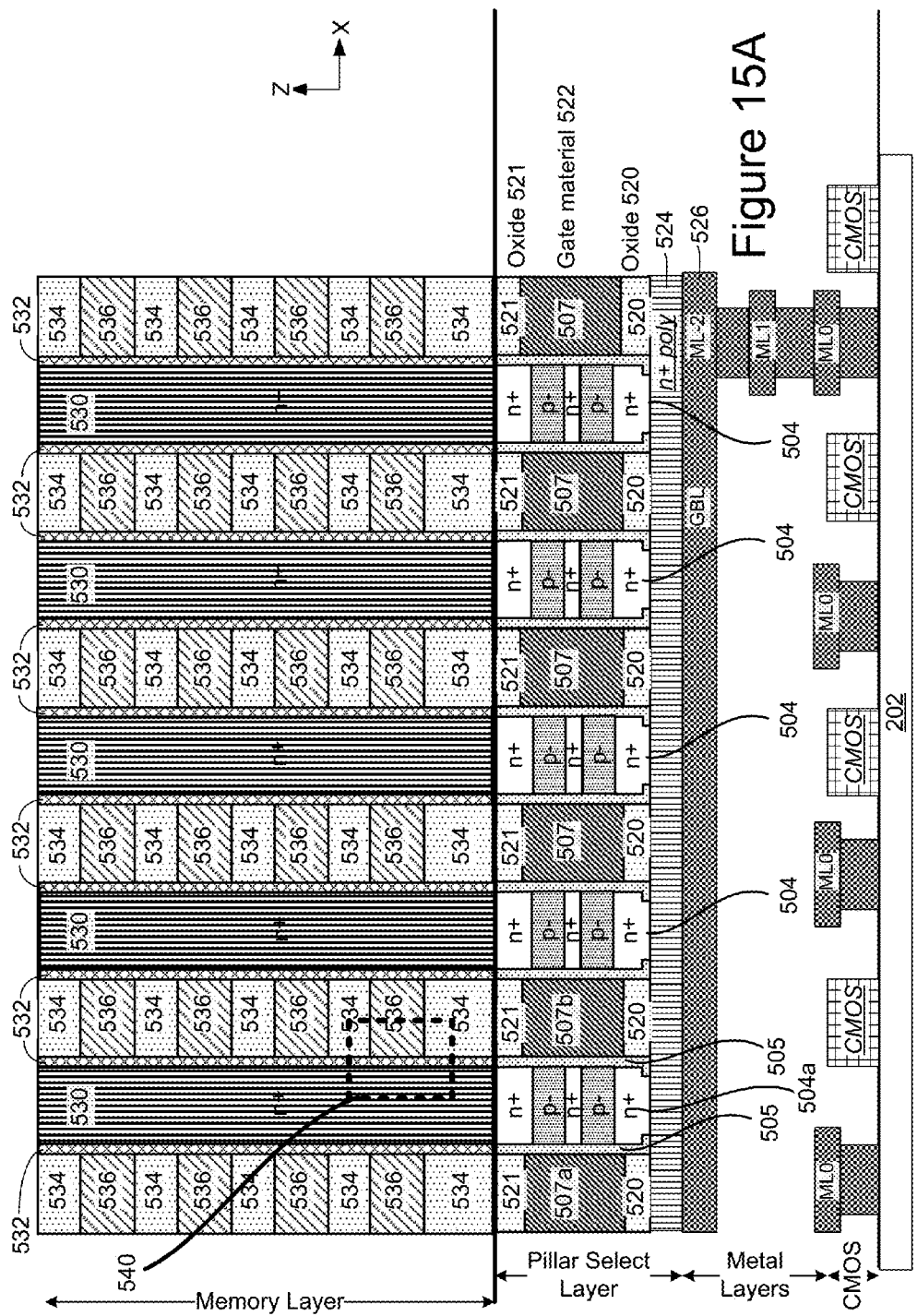

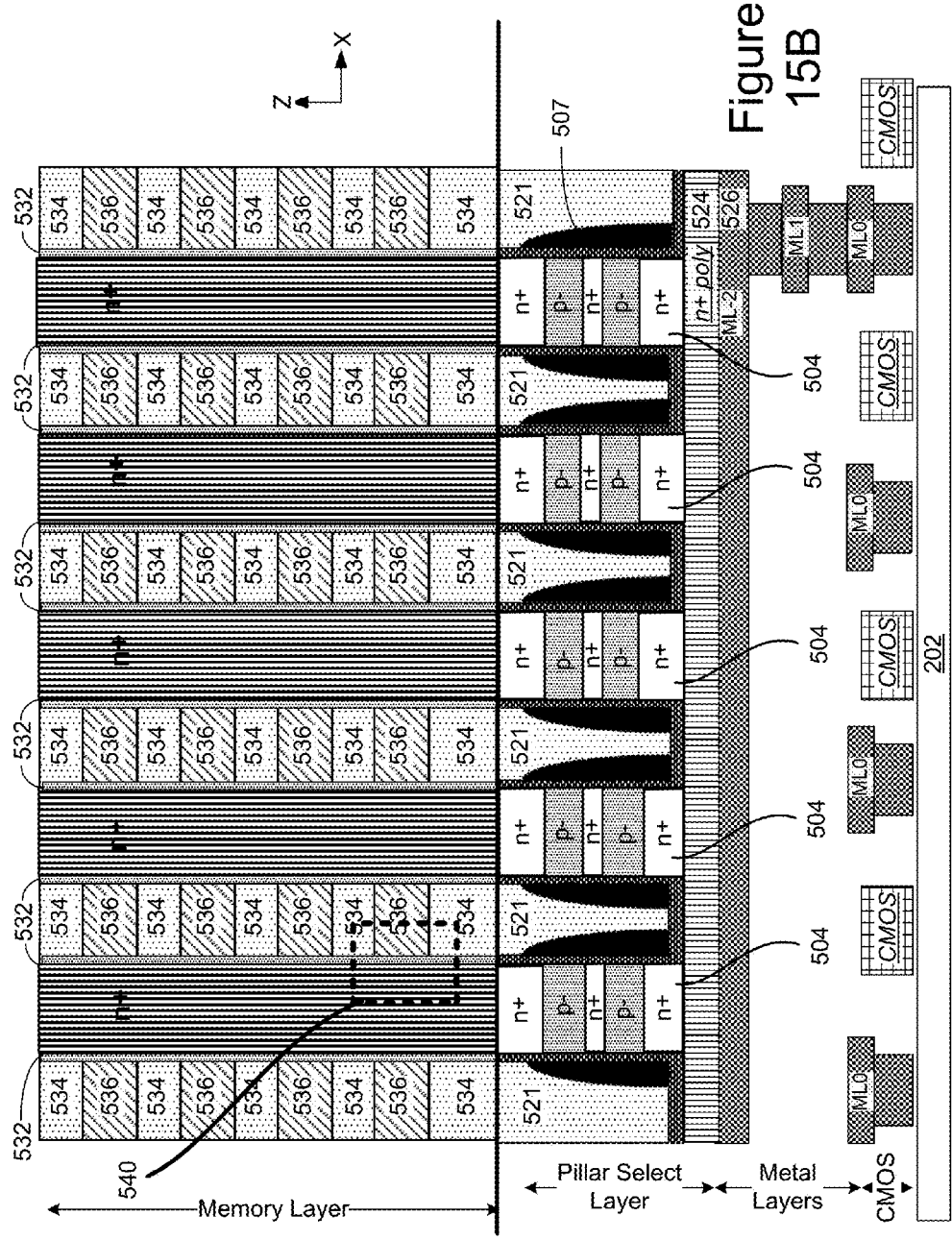

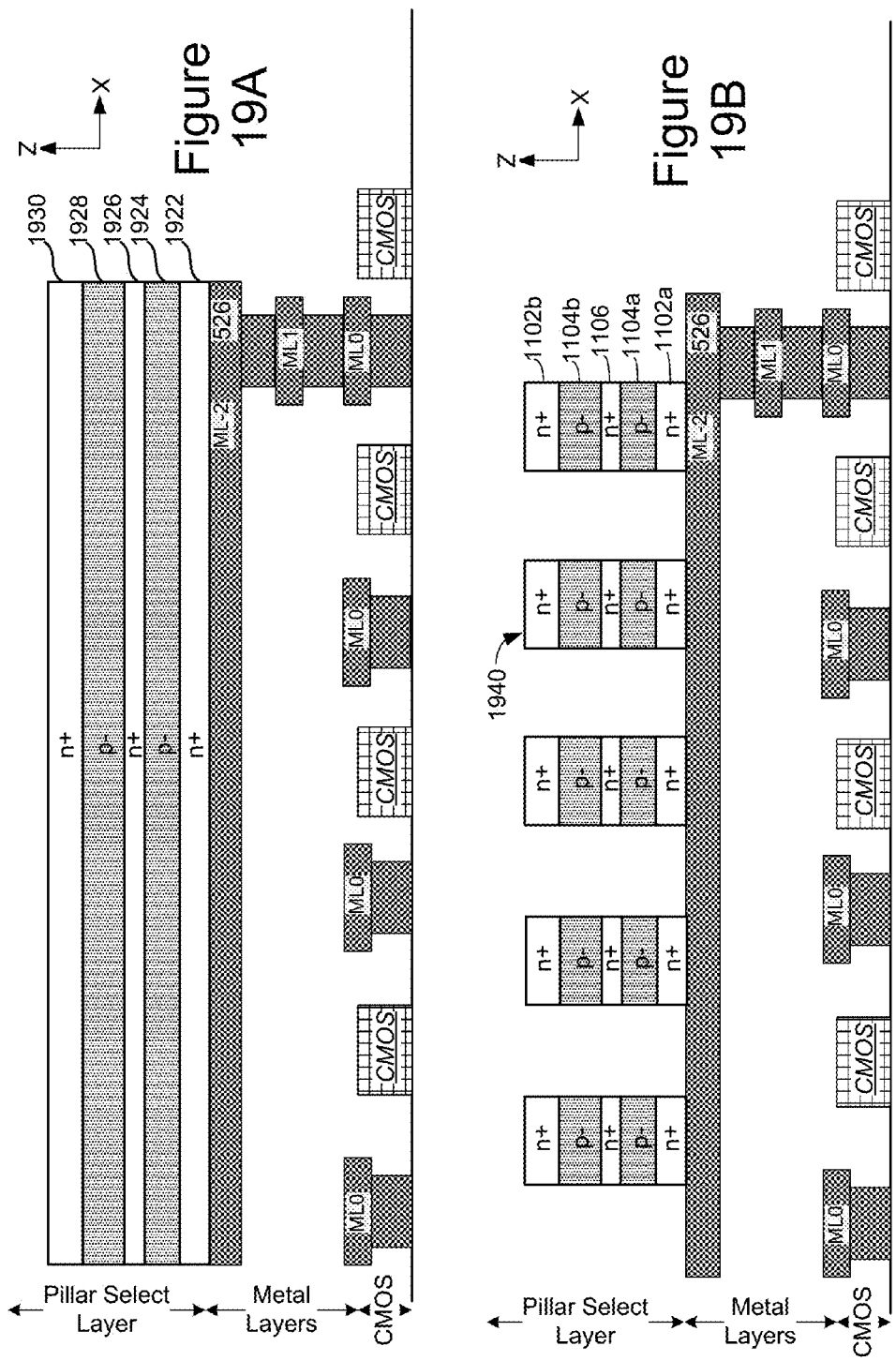

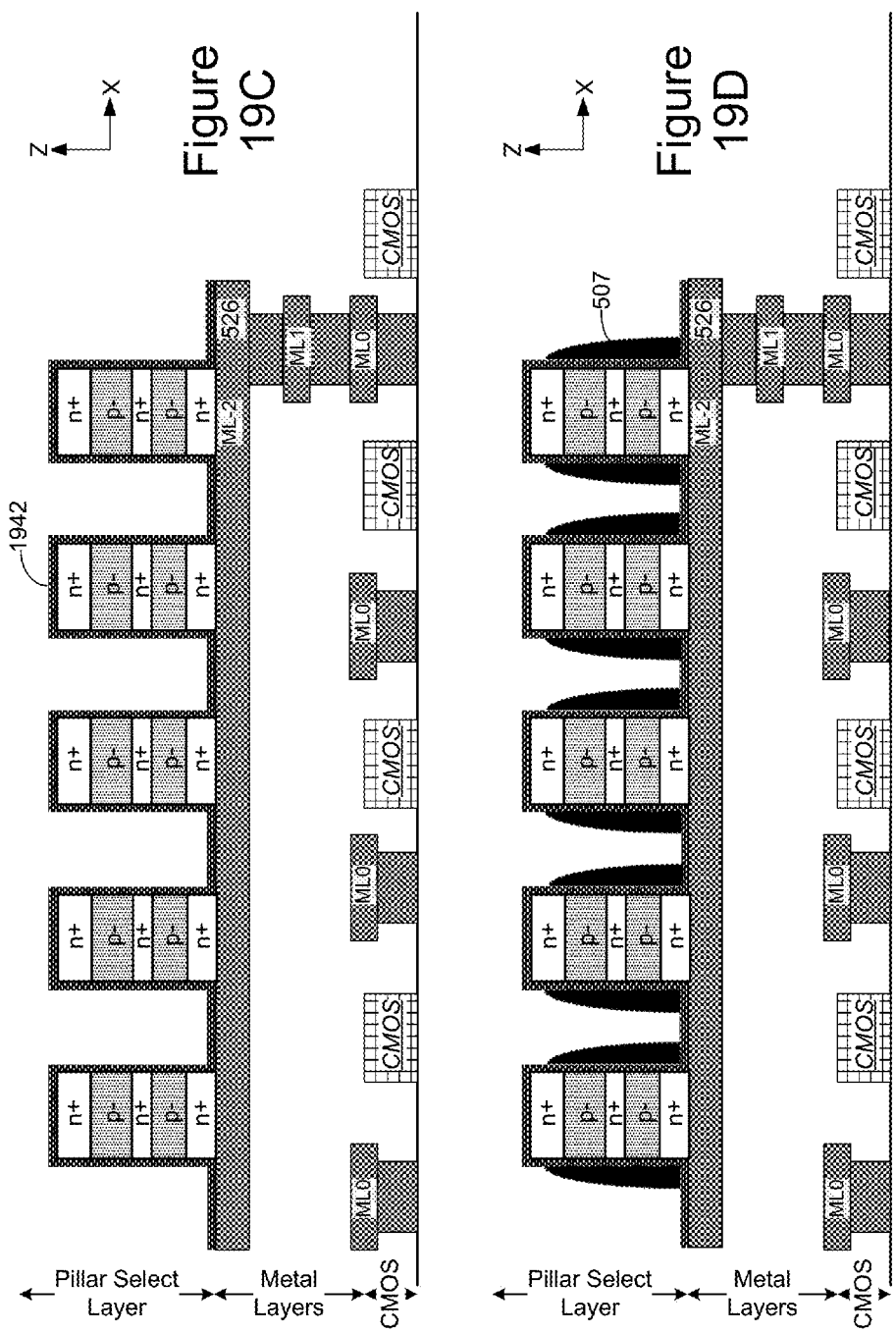

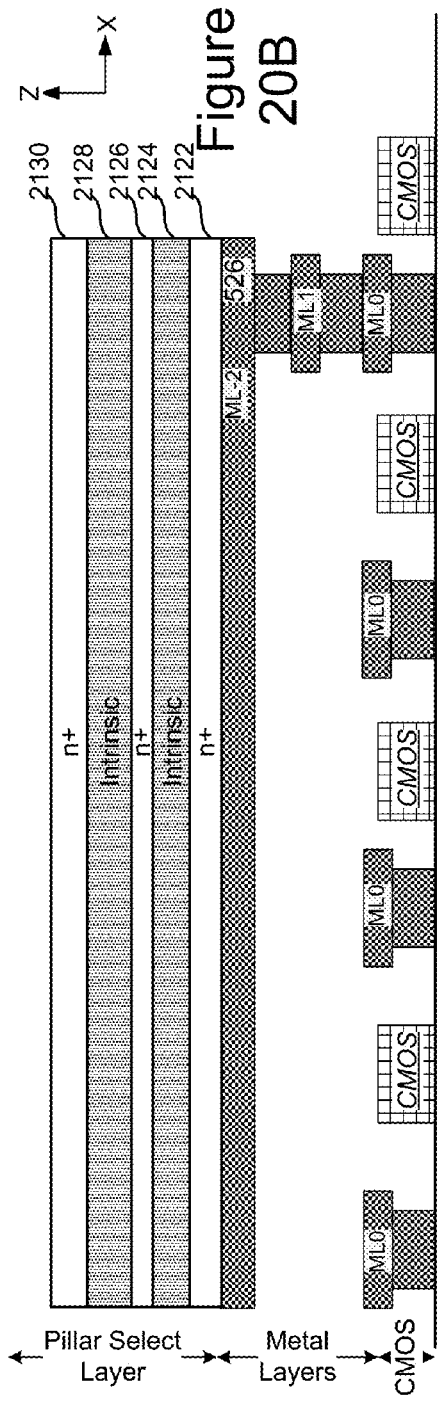
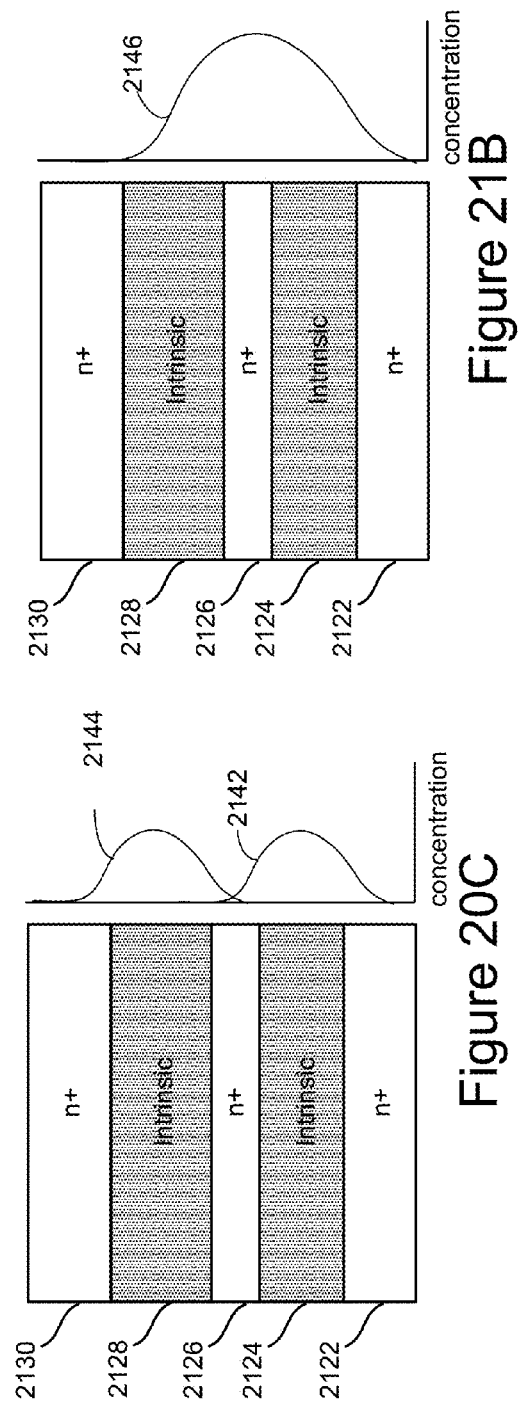
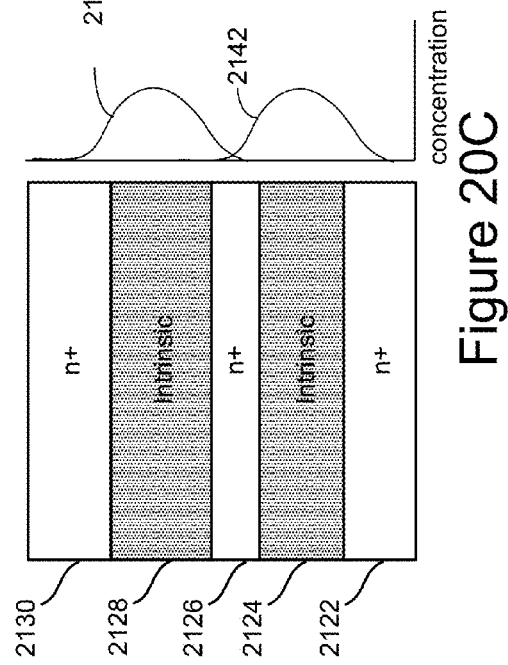

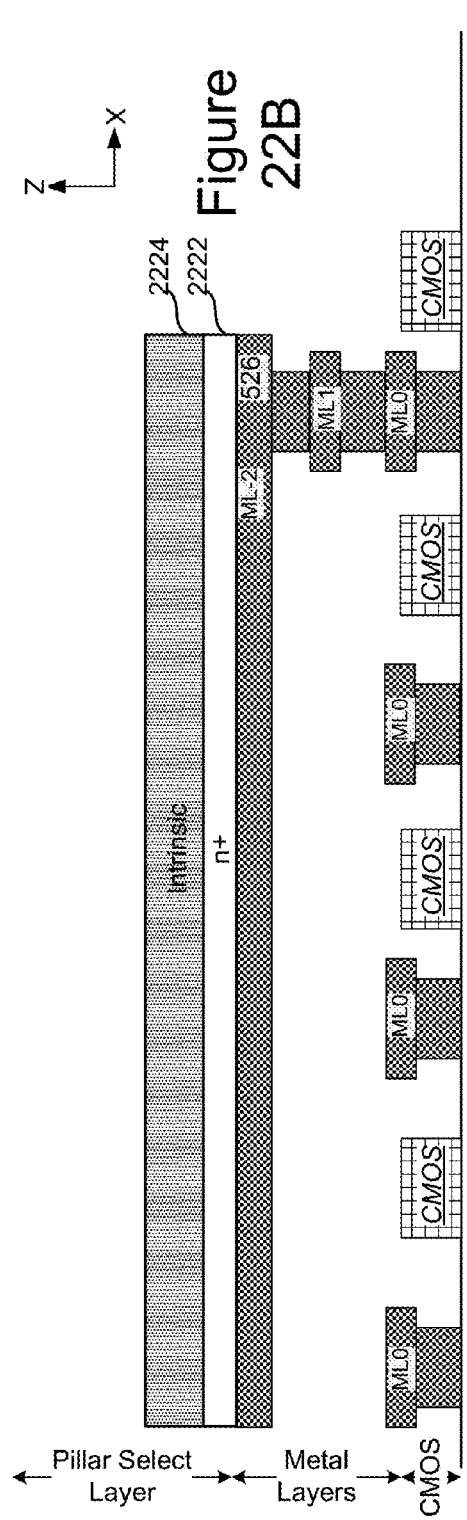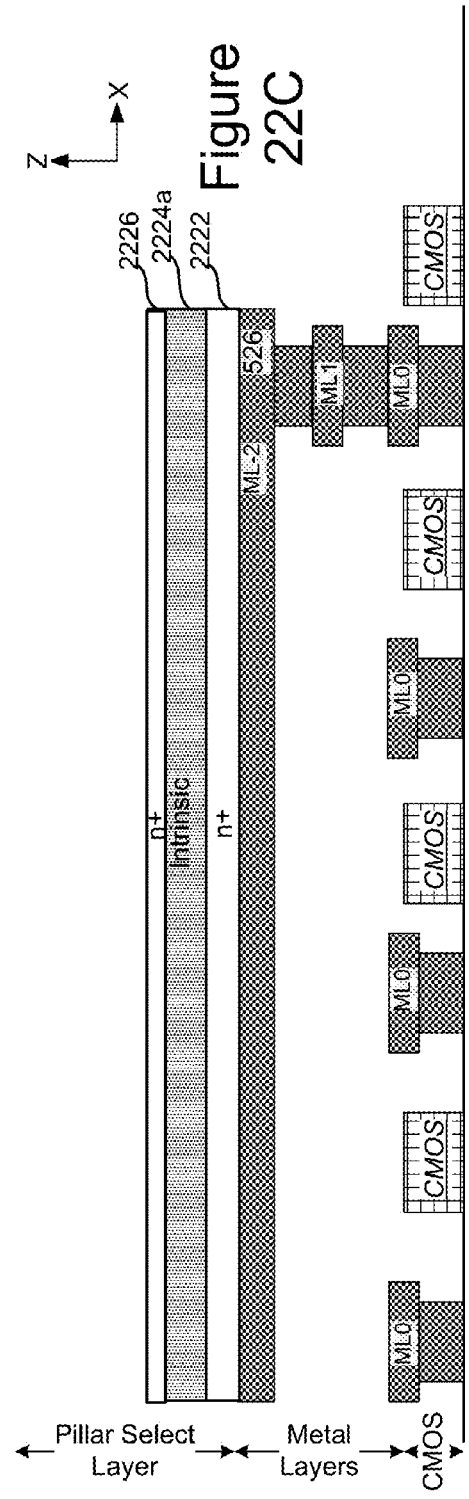

MULTIPLE JUNCTION THIN FILM TRANSISTOR

BACKGROUND

The present disclosure relates to technology for thin film transistors.

One use of a thin film transistor (TFT) is as a selection device. For example, the TFT can be used as a switch to electrically connect or disconnect two conductive regions. In this example, the source and drain of the TFT are connected to the respective two conductive regions. A control signal is applied to the gate of the TFT to control the electrical connection between the two conductive regions. This might be used to pass a signal from one conductive region to the other. As one particular example, a TFT selection device could be used to provide an electrical signal to a bit line in a non-volatile storage device. There are many other possible uses of a TFT.

BRIEF DESCRIPTION OF THE DRAWINGS

FIG. 12A is a graph that depicts an affect that one embodiment of the second body region has on the electric field (e-field) of the TFT.

FIG. 12B shows curves of impact ionization rate versus location along the channel of one embodiment of the two TFTs discussed with respect to FIG. 12A.

FIG. 13A is a graph that shows doping concentration versus position for embodiments of a multiple junction TFT.

FIG. 13B is a graph that shows the e-field versus position for to show the effect of the thickness of the second body region for the embodiments of FIG. 13A.

FIG. 15A is a cross-sectional view of a memory structure using one embodiment of a multiple junction vertically oriented TFT select device and the memory structure of FIG. 6.

FIG. 15B is a cross-sectional view of another embodiment of a memory structure using the vertically oriented TFT select device and the memory structure of FIG. 6.

FIGS. 19A-19E depict results after various steps of one embodiment of FIG. 18.

FIGS. 20B-20C depict results after various steps of one embodiment of FIG. 20A.

FIG. 21B roughly shows rough concentrations for the one step implant of the process of FIG. 21A.

FIGS. 22B-22C depict results after various steps of one embodiment of FIG. 22A.

DETAILED DESCRIPTION

Figure 1:
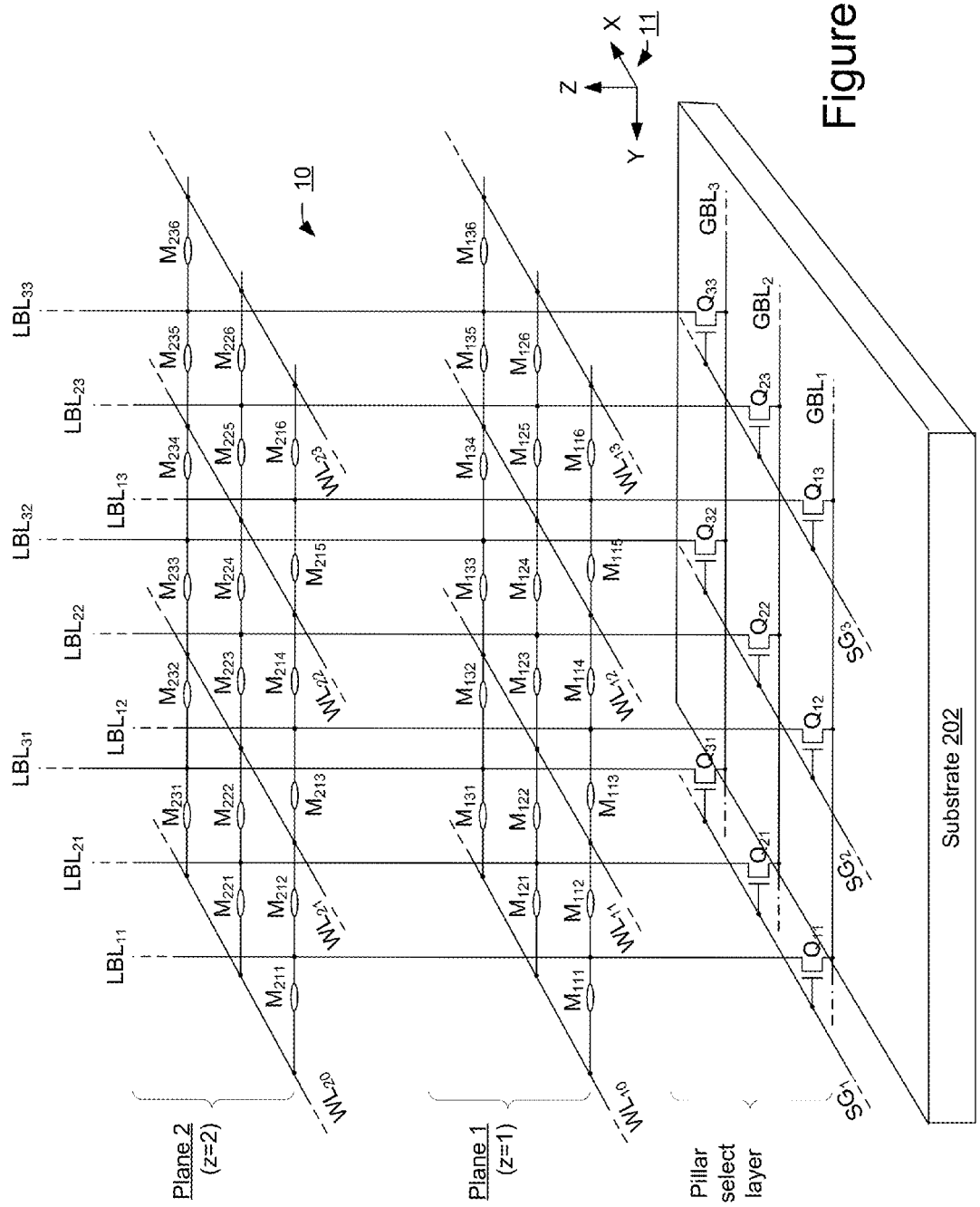
FIG. 1 is an equivalent circuit of a portion of an example three-dimensional array of variable resistance memory elements, wherein the array has vertical bit lines.

The technology described herein is directed to a vertically oriented, multiple junction, thin film transistor (TFT). The vertically oriented, multiple junction, TFT serves as a selection device, in one embodiment. In one embodiment, the TFT is used as a selection device in a three-dimensional memory device. The drain of the TFT may be connected to a vertical bit line that is connected to memory cells, and the source of the TFT being may be connected to a line that provides a voltage, as one example. The control gate of the TFT may be connected may be connected to circuitry that turns the TFT on or off in order to select the memory cells connected to the vertical bit line.

In one embodiment, the body of the TFT has an n+ layer residing in a p− region of the body. The TFT may have an n+ source and an n+ drain on either side of the p− region of the body. Thus, the TFT has an n+/p−/n+/p−/n+ structure, in this embodiment. The n+ layer in the p− region of the body helps to increase the breakdown voltage of the TFT. Also, the drive current is increased. Moreover, the impurity concentration in the n+ layer in the p− body and/or thickness of the n+ layer in the p− body may be tuned to increase performance of the TFT. In another embodiment, the body of the TFT has a p+ layer residing in an n− region of the body. The TFT may have a p+ source and a p+ drain on either side of the p− region of the body. This alternative also has a high breakdown voltage and high drive current.

One architecture in which the vertically oriented, multiple junction TFT may be used is a 3D memory array having reversible resistivity memory cells (also referred to as "variable resistance memory cells" or similar terminology). Each memory cell may reside between a bit line and a word line. In one embodiment, the bit line is vertically oriented with respect to a major surface of a substrate on which the 3D memory array is formed. The reversible resistivity memory cells are one type of non-volatile memory cell. A memory cell may also be referred to as a "storage element".

Upon application of sufficient voltage, current, or other stimulus, the reversible resistivity memory element switches to a stable low-resistance state, which is sometimes referred to as "setting" the device. This resistivity-switching is reversible such that subsequent application of an appropriate voltage, current, or other stimulus can serve to return the reversible resistivity-switching material to a stable high-resistance state, which is sometimes referred to as "resetting" the device. This conversion can be repeated many times.

The reversible resistivity memory elements may be in a high resistance state when first manufactured. This may be referred to as the "virgin state." In the virgin state, the resistance could be even higher than for the reset state. The term "forming" is sometimes used to describe putting the reversible resistivity memory elements into a lower resistance state for the first time. For some memory elements, the forming operation requires a higher voltage than the "set" and/or "reset" operations.

3D memory arrays having reversible resistivity memory elements have been proposed. In one possible architecture, word lines extend horizontally and bit lines extend vertically. There a multiple levels of the word lines, hence multiple levels of memory elements. Each memory element is located between one of the vertical bit lines and one of the horizontal word lines. During operation, some of the memory cells are selected for the set, reset, or form operation, while others are unselected.

FIG. 1 depicts an architecture of one embodiment of a three-dimensional memory 10 schematically and generally illustrated in the form of an equivalent circuit of a portion of such a memory. A standard three-dimensional rectangular coordinate system 11 is used for reference, the directions of each of vectors x, y and z being orthogonal with the other two. In another embodiment, direction x and y are substantially 60 degrees from each other.

A circuit for selectively connecting internal memory elements with external data circuits is preferably formed using select devices $Q_{xy}$, where x gives a relative position of the device in the x-direction and y its relative position in the y-direction. The individual select devices $Q_{xy}$ are multiple junction vertical TFTs, in accordance with embodiments. The multiple junction vertical TFTs have a high breakdown voltage and high drive current.

Global bit lines ($GBL_x$) are elongated in the y-direction and have relative positions in the x-direction that are indicated by the subscript. The global bit lines ($GBL_x$) are individually connectable with the source or drain of the vertical TFT select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of multiple junction vertical TFT select devices $Q_{xy}$ having a common position in the y-direction. The multiple junction vertical TFT select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the vertical TFT select devices to which it is connected. The remaining row select lines receive voltages that keep their connected multiple junction vertical TFT select devices $Q_{xy}$ off. It may be noted that since only one multiple junction vertical TFT select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above a substrate 202 (which is below the pillar select layer). The substrate 202 has a major surface that extends in the xy-plane. The substrate 202 may be a semiconductor substrate, such as a silicon substrate. The substrate 202 may be formed from a semiconductor wafer. As will be discussed below, various circuitry can be formed in the substrate 202.

Two planes 1 and 2 are illustrated in FIG. 1 but there will typically be more, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. After the device is first fabricated, voltages may be selected to provide the electrical stimulus necessary to "form" the memory element, which refers to lowering its resistance from a virgin state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above the semiconductor substrate 202 with the local bit lines $LBL_{xy}$ being connected with storage elements $M_{zxy}$ of each plane through which the local bit lines extend.

The memory arrays described herein, including memory 10, may be monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

The reversible resistivity memory cells in the 3D memory array may be controlled by applying the proper voltages to their vertical bit lines and word lines. By applying either a select voltage or an unselect voltage to the vertical bit lines, while applying either a select voltage or an unselect voltage to the horizontal word lines, memory cells are selected/unselected for the operation (e.g., set, reset, and form). The vertically oriented TFT provides the proper voltage to the vertical bit line.

It is important that unselected memory elements remain unselected. Selection of the vertically oriented bit lines themselves is achieved by a multiple junction vertical TFT, in one embodiment. Typically, some of the multiple junction vertical TFTs are turned on to select memory elements, while other multiple junction vertical TFTs are kept off to keep other memory elements unselected. In this manner the multiple junction vertical TFTs provide suitable voltages to the vertically oriented bit lines. Word lines are driven with suitable voltages, as well.

One potential problem with the transistor that selects the vertically oriented bit lines is that the transistor may not have a sufficiently high breakdown voltage. If a transistor selection device that is supposed to be off breaks down, then the transistor could apply an unintended voltage to the vertically oriented bit line. Thus, having a high breakdown voltage is an important characteristic. This can be especially important when performing a forming operation, although a high breakdown voltage may also benefit set and reset operations. A multiple jucntion vertical TFT of one embodiment disclosed herein has a high breakdown voltage.

High gate to drain potential difference also results in high electric field component in the direction perpendicular to the gate dielectric (perpendicular to the direction of channel) contributing to overall electric field increase. The total electric field at the gate/drain edge is then determined by the lateral, or along the channel, field component (dependent on source to drain bias) and the perpendicular to the channel component of the field. When total field is high enough (i.e., voltages high enough), this can trigger impact ionization-generation and breakdown. A multiple junction vertical TFT of one embodiment disclosed herein has a reduced peak electric field at the drain side. This reduces the impact ionization-generation.

Figure 2:
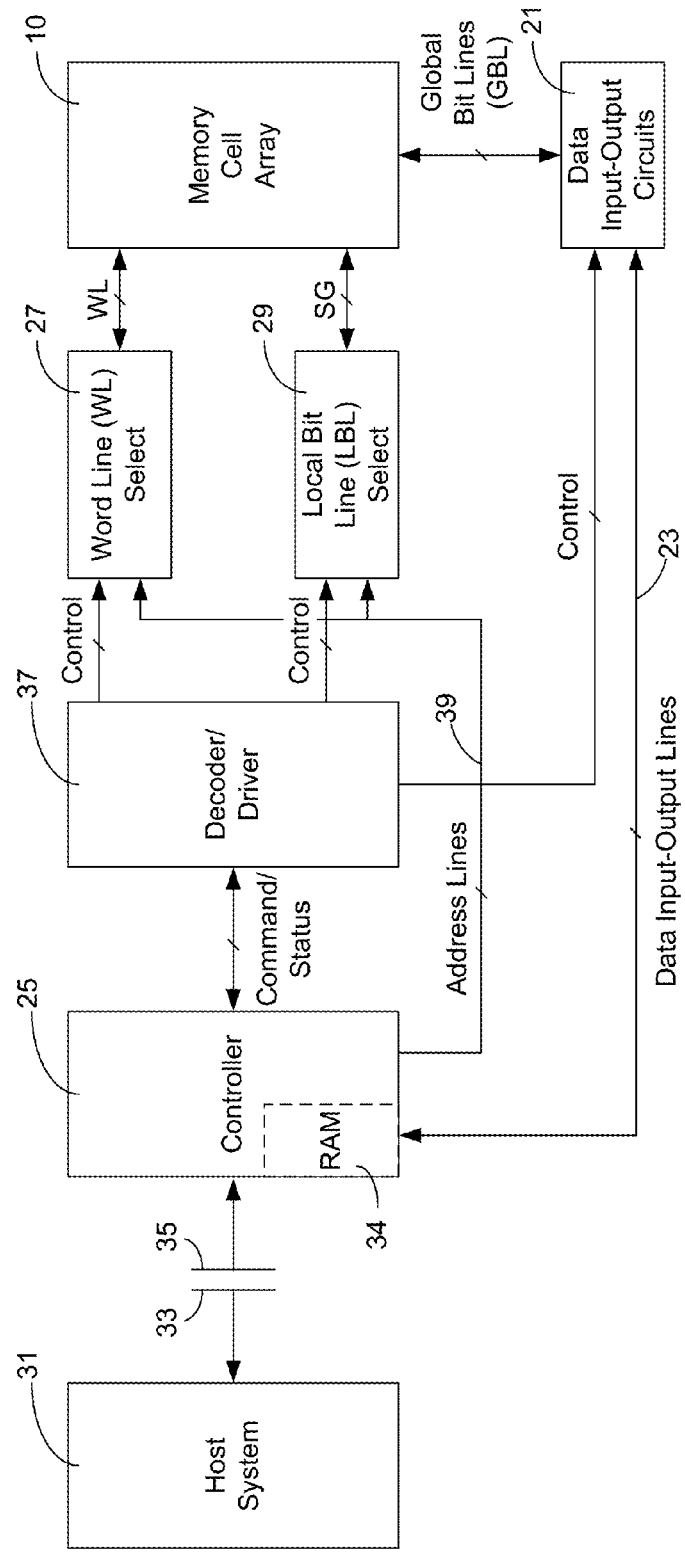
FIG. 2 is a schematic block diagram of a re-programmable non-volatile memory system which utilizes the memory array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory elements $Mz_{xy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although each of the memory elements $M_{zxy}$ in the array of FIG. 1 may be individually addressed for changing its state according to incoming data or for reading its existing storage state, it may be preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is may be preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to flash memory arrays. Resetting a block of memory elements to a common state corresponds to erasing a block of flash memory elements to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
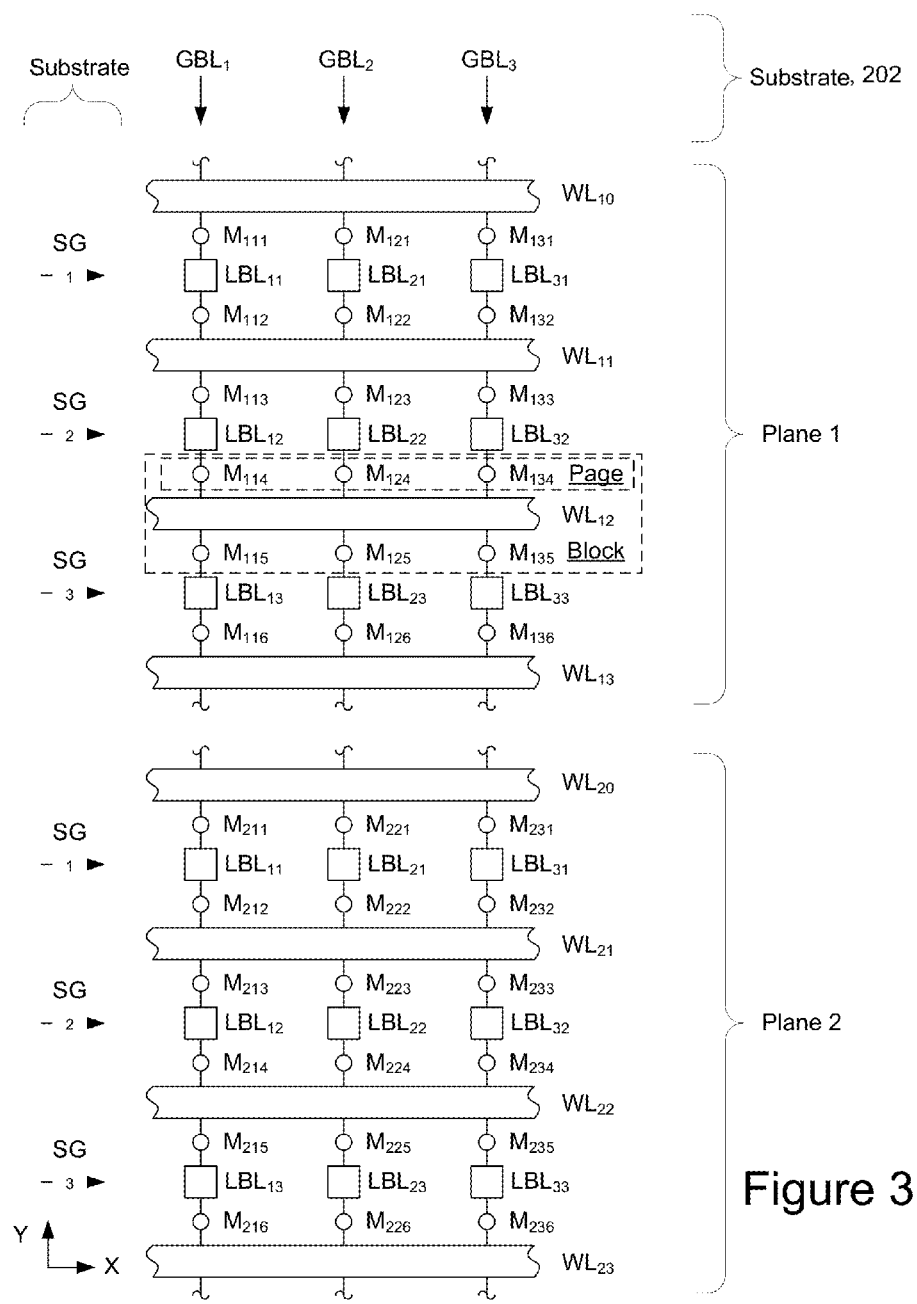
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming (e.g., setting) and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1," depending upon the memory element state.

To reset (e.g., erase) a block of memory elements, the memory elements in that block are placed into their high resistance state. This state will be designated as the logical data state "1," following the convention used in current flash memory arrays but it could alternatively be designated to be a "0." As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines (GBL$_1$, GBL$_2$ and GBL$_3$ in the array of FIGS. 1 and 3) to zero volts, by the circuits 21 of FIG. 2.
2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn on the vertical TFT select devices $Q_{xy}$, for example, something in a range of 1-6 volts, typically 3 volts. The block shown in FIG. 3 includes the word line WL$_{12}$, so the row select lines SG$_2$ and SG$_3$ (FIG. 1) on either side of that word line are set to H' volts, by the circuits 29 of FIG. 2, in order to turn on the vertical TFT select devices $Q_{12}$, $Q_{22}$, $Q_{32}$, $Q_{13}$, $Q_{23}$ and $Q_{33}$. This causes each of the local bit lines LBL$_{12}$, LBL$_{22}$, LBL$_{32}$, LBL$_{13}$, LBL$_{23}$ and LBL$_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.
3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line WL$_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements M$_{114}$, M$_{124}$, M$_{134}$, M$_{115}$, M$_{125}$ and M$_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required. In some embodiments, less than all memory elements of a block will be simultaneously reset.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
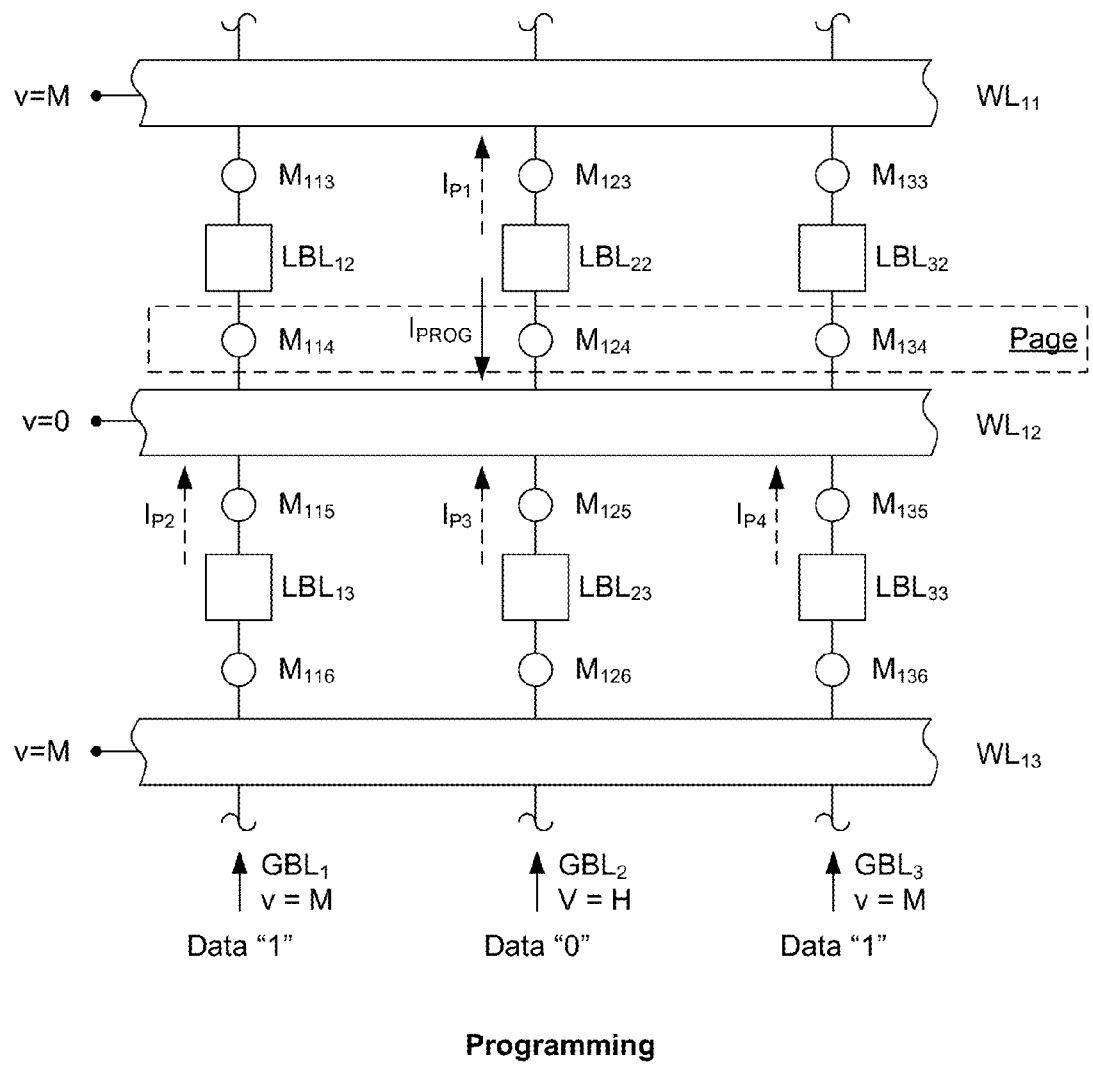
FIG. 4 is an expanded view of a portion of one of the planes of FIG. 3, annotated to show effects of programming data therein.

Referring to FIGS. 3 and 4, an example programming operation within the indicated one page of memory elements M$_{114}$, M$_{124}$ and M$_{134}$ is described, as follows:

1. The voltages placed on the global bit lines are in accordance with the pattern of data received by the memory system for programming. In the example of FIG. 4, GBL$_1$ carries logical data bit "1", GBL$_2$ the logical bit "0" and GBL3 the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements M$_{114}$ and M$_{134}$ are to remain in their reset state, while memory element M$_{124}$ is being programmed. Therefore, the programming voltages are applied only to memory element M$_{124}$ of this page by the following steps.
2. Set the word line of the page being programmed to 0 volts, in this case selected word line WL$_{12}$. This is the only word line to which the memory elements of the page are connected. Each of the other word lines on all planes is set to the M level. These word line voltages are applied by the circuits 27 of FIG. 2.
3. Set one of the row select lines below and on either side of the selected word line to the H' voltage level, in order to select a page for programming. For the page indicated in FIGS. 3 and 4, the H' voltage is placed on row select line SG$_2$ in order to turn on select devices Q$_{12}$, Q$_{22}$ and Q$_{32}$ (FIG. 1). All other row select lines, namely lines SG$_1$ and SG$_3$ in this example, are set to 0 volts in order to keep their select devices off. The row select line voltages are applied by the circuits 29 of FIG. 2. This connects one row of local bit lines to the global bit lines and leaves all other local bit lines floating. In this example, the row of local bit lines LBL$_{12}$, LBL$_{22}$ and LBL$_{32}$ are connected to the respective global bit lines GBL$_1$, GBL$_2$ and GBL$_3$ through the select devices that are turned on, while all other local bit lines (LBLs) of the array are left floating.

The result of this operation, for the example memory element material mentioned above, is that a programming current IPROG is sent through the memory element M$_{124}$, thereby causing that memory element to change from a reset state to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-16 planes may generally be used in most cases, but a different amount can also be used.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed.

Figure 5:
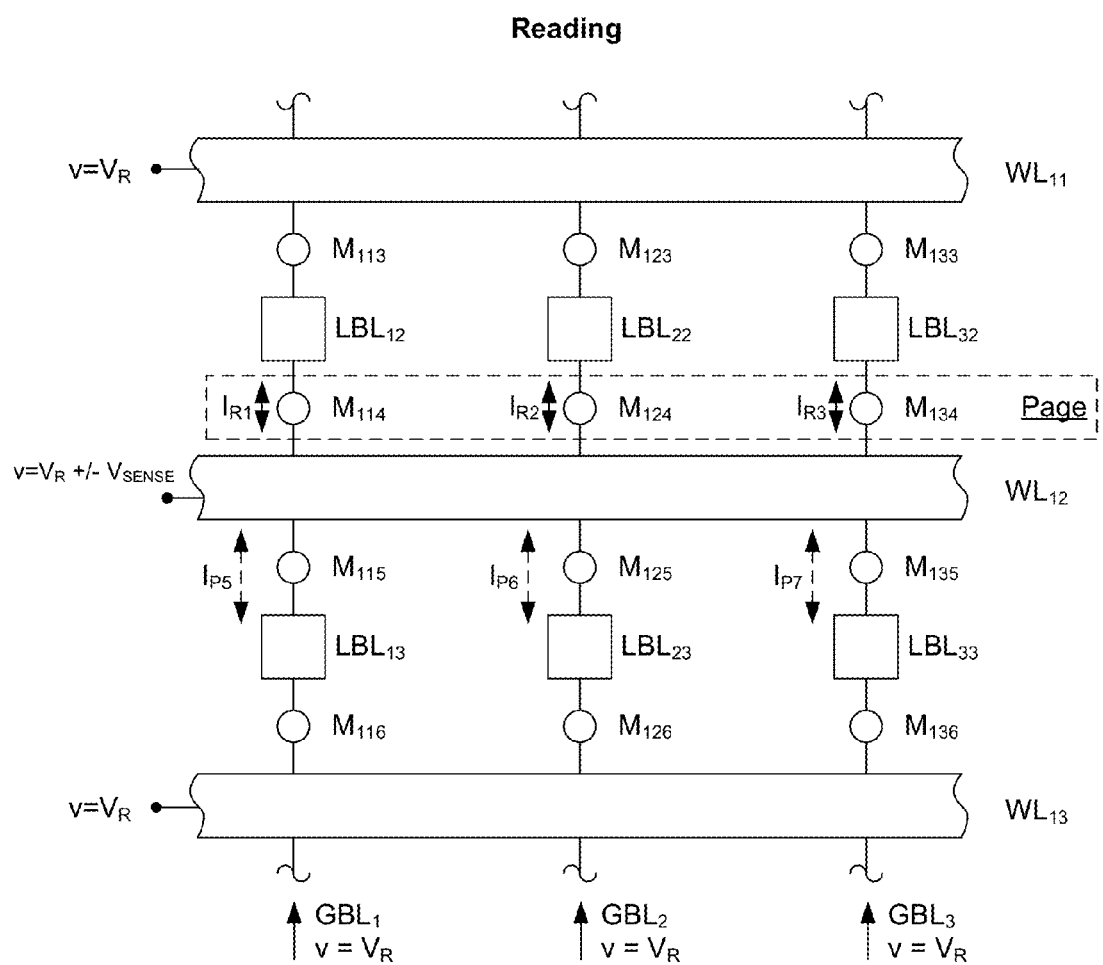
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn on one row of select devices by placing a voltage on the control line adjacent to the selected word line in order to define the page to be read. In the example of FIGS. 1 and 5, a voltage is applied to the row select line $SG_2$ in order to turn on the vertical TFT select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.

3. Set the selected word line (WL$_{12}$) to a voltage of V$_R$±Vsense. The sign of Vsense is chosen based on the sense amplifier and has a magnitude of about 0.5 volt. The voltages on all other word lines remain the same.

4. Sense current flowing into (V$_R$+Vsense) or out of (V$_R$−Vsense) each sense amplifier for time T. These are the currents I$_{R1}$, I$_{R2}$ and I$_{R3}$ shown to be flowing through the addressed memory elements of the example of FIG. 5, which are proportional to the programmed states of the respective memory elements M$_{114}$, M$_{124}$ and M$_{134}$. The states of the memory elements M$_{114}$, M$_{124}$ and M$_{134}$ are then given by binary outputs of the sense amplifiers within the circuits 21 that are connected to the respective global bit lines GBL$_1$, GBL$_2$ and GBL$_3$. These sense amplifier outputs are then sent over the lines 23 (FIG. 2) to the controller 25, which then provides the read data to the host 31.

5. Turn off the vertical TFT select devices (Q$_{12}$, Q$_{22}$ and Q$_{32}$) by removing the voltage from the row select line (SG$_2$), in order to disconnect the local bit lines from the global bit lines, and return the selected word line (WL$_{12}$) to the voltage V$_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row (LBL$_{12}$, LBL$_{22}$ and LBL$_{32}$ in the example of FIG. 5) are floating. But the potential of the floating local bit lines may be driven to V$_R$ by any memory element that is in its programmed (low resistance) state and connected between a floating local bit line and a word line at V$_R$, in any plane. A parasitic current comparable to I$_{P1}$ in the programming case (FIG. 4) is not present during data read because both the selected local bit lines and the adjacent non-selected word lines are both at V$_R$. Parasitic currents may flow, however, through low resistance memory elements connected between floating local bit lines and the selected word line. These are comparable to the currents I$_{P2}$, I$_{P3}$, and I$_{P4}$ during programming (FIG. 4), indicated as I$_{P5}$, I$_{P6}$ and I$_{P7}$ in FIG. 5. Each of these currents can be equal in magnitude to the maximum read current through an addressed memory element. However, these parasitic currents are flowing from the word lines at the voltage V$_R$ to the selected word line at a voltage V$_R$±Vsense without flowing through the sense amplifiers. These parasitic currents will not flow through the selected local bit lines (LBL$_{12}$, LBL$_{22}$ and LBL$_{32}$ in FIG. 5) to which the sense amplifiers are connected. Although they contribute to power dissipation, these parasitic currents do not therefore introduce a sensing error.

Although the neighboring word lines should be at V$_R$ to minimize parasitic currents, as in the programming case it may be desirable to weakly drive these word lines or even allow them to float. In one variation, the selected word line and the neighboring word lines can be pre-charged to V$_R$ and then allowed to float. When the sense amplifier is energized, it may charge them to V$_R$ so that the potential on these lines is accurately set by the reference voltage from the sense amplifier (as opposed to the reference voltage from the word line driver). This can occur before the selected word line is changed to V$_R$±Vsense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two-step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials. For these reasons, the embodiments discussed below utilize memory elements that include resistance switching material and do not include a diode or other separate steering device. The use of memory elements that have a non-linear current versus voltage relationship are also envisioned. For example as the voltage across an $HfO_x$ memory element is reduced from the programming voltage to one half the programming voltage the current is reduced by a factor of 5 or even more. In such an embodiment the total magnitude of parasitic currents can be managed without the use of diodes in the array.

The level of parasitic currents increases with the number of planes and with the number of memory elements connected along the individual word lines within each plane. The increase in parasitic currents increases only slightly with additional planes because the selected word line is on only one plane such as $WL_{12}$ in FIG. 4. Parasitic currents Ip1, Ip2, Ip3, and Ip4 are all on the plane that contains WL12. Leakage currents on other planes are less significant because the floating lines tend to minimize currents on elements not directly connected to the selected word line. Also since the number of unselected word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory element to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory elements on each current path and thus the leakage currents are reduced as is the number of unselected memory elements disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 16), or N+n cells are associated with a data operation. For a large N this means that the number of cells affected by a data operation is approximately one-half as many as in a conventional three-dimensional array.

Materials Useful for the Memory Storage Elements

The material used for the non-volatile memory elements $M_{zxy}$ in the array of FIG. 1 can be a chalcogenide, a metal oxide, CMO, or any one of a number of materials that exhibit a stable, reversible shift in resistance in response to an external voltage applied to or current passed through the material.

Metal oxides are characterized by being insulating when initially deposited. One suitable metal oxide is a titanium oxide ($TiO_x$) in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements $M_{zxy}$ in the array of FIG. 1 include $HfO_x$, $ZrO_x$, $WO_x$, $NiO_x$, $CoO_x$, $CoAlO_x$, $MnO_x$, $ZnMn_2O_4$, $ZnO_x$, $TaO_x$, $NbO_x$, $HfSiO_x$, $HfAlO_x$. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich $TiO_x$, TiAlN, TaAlN, TiSiN, TaSiN, $IrO_2$ and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g, bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has considered the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC).

Structural Example of the Three-Dimensional Array

Figure 6:
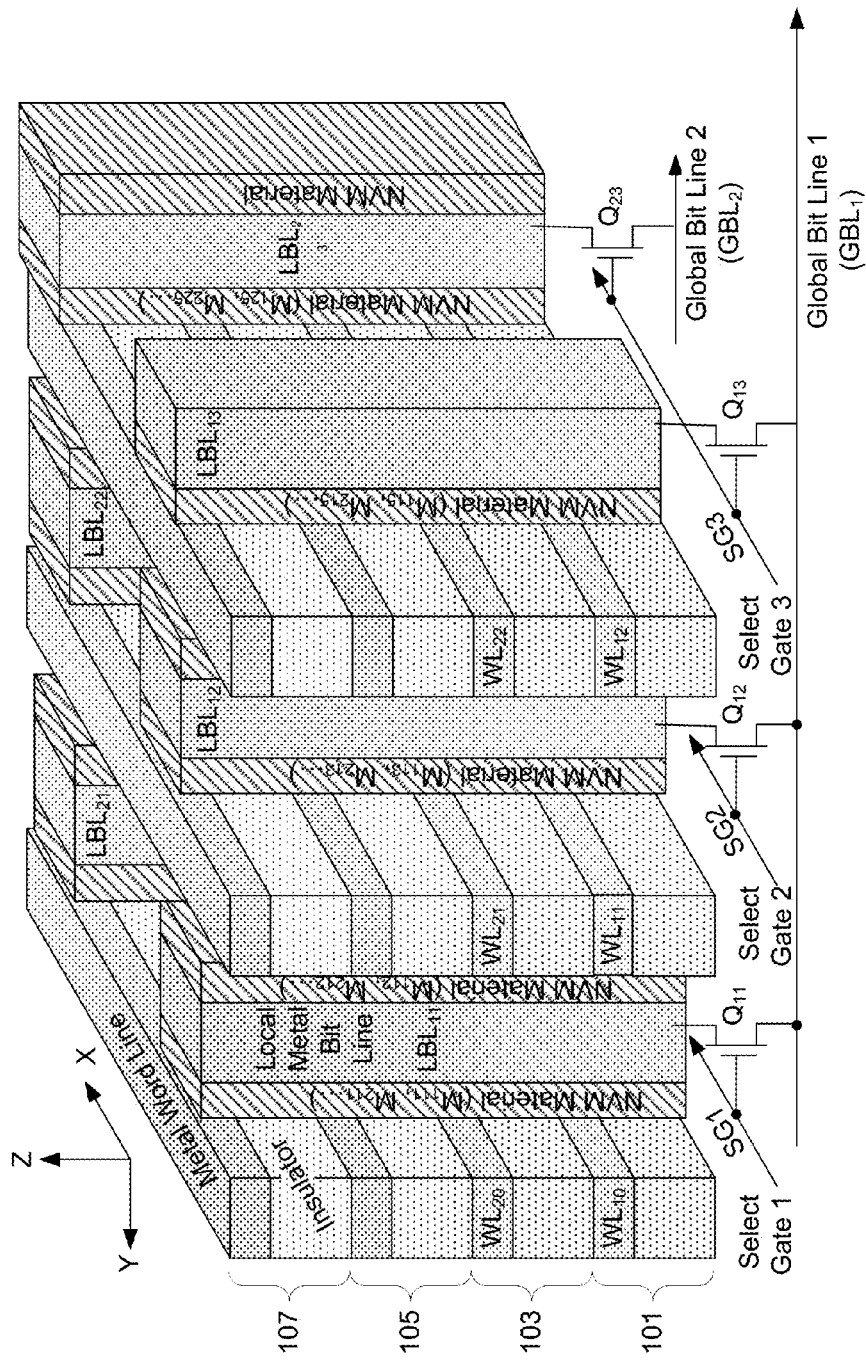
FIG. 6 is an isometric view of a portion of the three-dimensional array shown in FIG. 1 according to a first specific example of an implementation thereof

One example semiconductor structure for implementing the three-dimensional memory element array of FIG. 1 is illustrated in FIG. 6, which is configured for use of non-volatile memory element (NVM) material that is non-conductive when first deposited. A metal oxide of the type discussed above has this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. It will be noted that FIG. 6 shows the two planes 1 and 2 of FIG. 1 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) running in the y-direction at the same pitch as the pillar spacing through the multiple junction vertical TFT select devices ($Q_{xy}$) whose gates are driven by the row select lines (SG) elongated in the x-direction.

Not shown in FIG. 6 are sense amplifiers, input-output (I/O) circuitry, control circuitry, and any other necessary peripheral circuitry. There is one row select line (SG) for each row of local bit line pillars in the x-direction and one vertical TFT select device (Q) for each individual vertical local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

Multiple Junction Vertical TFT Decoder

To enable the memory to be denser (e.g., more memory elements per area), the size of the memory elements can be made small and the memory elements can be arranged close to each. To enable the memory elements to be close to each other, one embodiment uses a multiple junction vertically oriented TFT decoder (or select device) for connecting the individual local vertical bit line pillars to the respective global bit lines. In one embodiment, each multiple junction vertical vertically oriented TFT select device is a pillar select device that is formed as a vertical structure, switching between a local bit line pillar and a global bit line. The vertical TFT select devices, are in the present embodiments formed in a separate layer (pillar select layer) above the CMOS layer/substrate 202, along the z-direction between the array of global bit lines and the array of local bit lines. The CMOS layer is the substrate 202 where the support circuitry is implemented, including the row select circuit and word line drivers. The use of vertically oriented TFT select devices above, but not in, the substrate 202 allows the memory elements to be arranged in a more compact fashion, thereby increasing density. Additionally, positioning the multiple junction vertically oriented TFT select devices above the substrate 202 allows for other devices (e.g., the word line drivers) to be positioned in the substrate 202 under the memory array rather than outside of the array, which allows the integrated circuit to be smaller.

For example, a pillar shaped vertical Thin Film Transistor (TFT) can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 7:
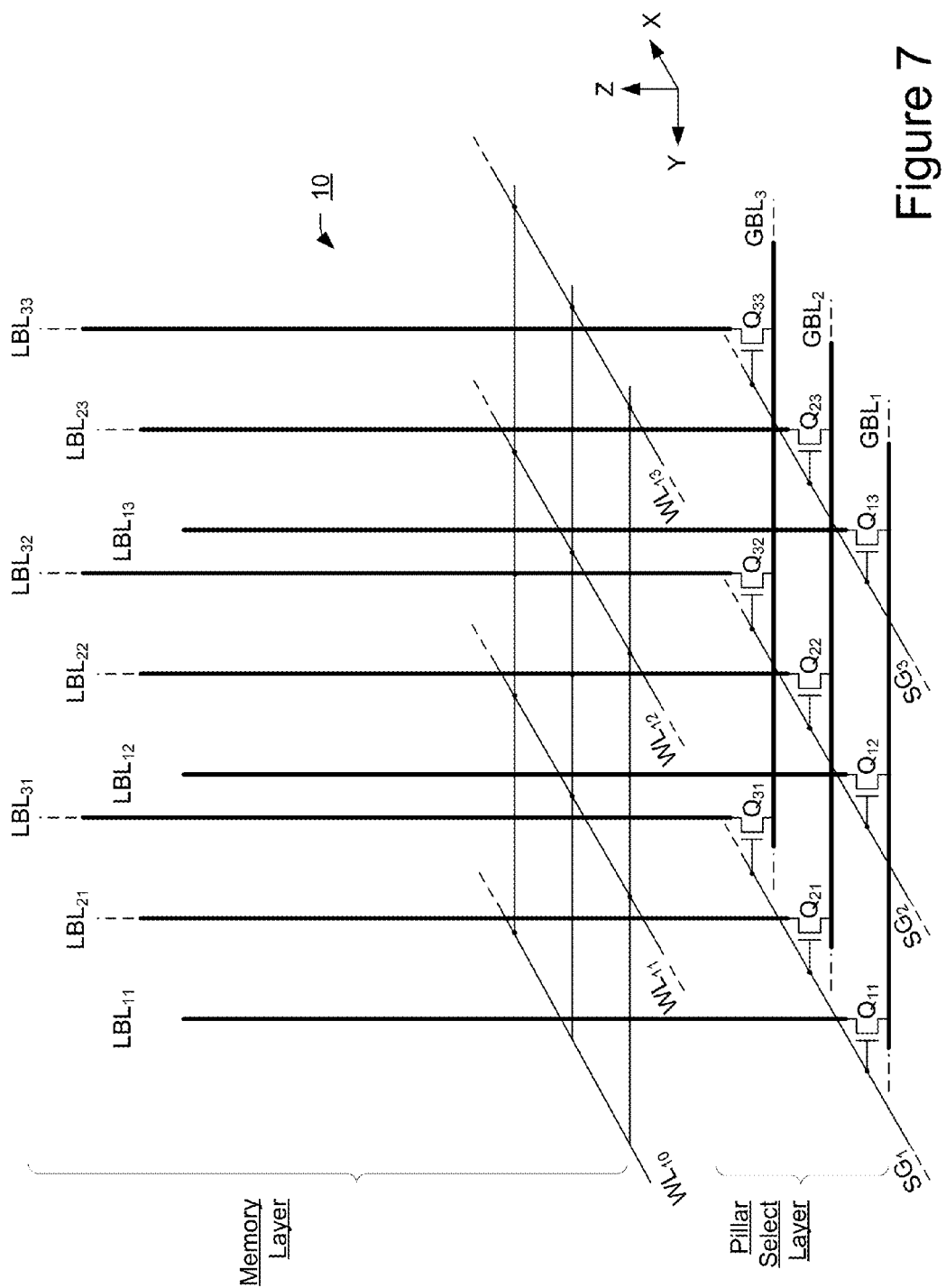
FIG. 7 is an equivalent circuit of a portion of an example three-dimensional array of variable resistance memory elements, wherein the array has vertical bit lines and a pillar select layer, both of which are above (and not in) the substrate.

FIG. 7 illustrates schematically the three dimensional memory ("3D memory") comprising of a memory layer on top of a pillar select layer. The 3D memory 10 is formed on top of a CMOS substrate (not shown explicitly) where structures in the CMOS are referred to as being in the FEOL ("Front End of Lines"). The vertically oriented TFT select devices switching individual vertical bit lines (that are above and not in the substrate) to individual global bit lines are now formed on top of the FEOL layer in the BEOL ("Back End of Lines"). Thus, the BEOL comprises of the pillar select layer with the memory layer on top of it. The vertically oriented TFT select devices (such as $Q_{11}$, $Q_{12}, \ldots, Q_{21}, Q_{22}, \ldots$, etc.) are formed in the pillar select layer as vertically oriented TFT select devices. The pillar select layer is formed above (and not in) the substrate. The memory layer comprises multiple layers of word lines and memory elements. For simplicity, FIG. 7 shows only one layer of word lines, such as $WL_{10}, W_{11}, \ldots$, etc without showing the memory elements that exist between each crossing of a word line and a bit line.

In the example of FIG. 7, the multiple junction vertically oriented TFT select devices have one gate that is connected to one of the select lines. In some embodiments, each vertically oriented TFT select device has two gates.

Figure 8B:
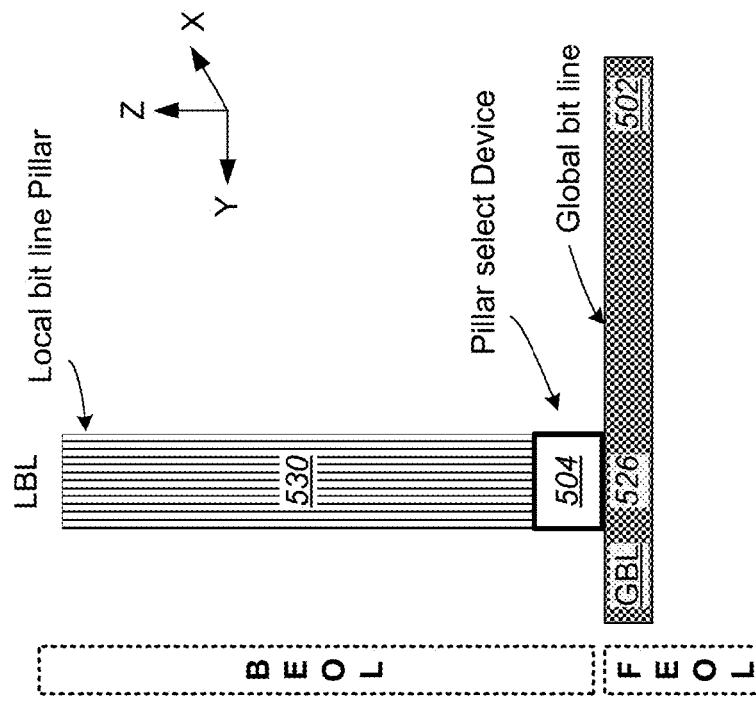
FIG. 8B is a plan view that depicts a vertical bit line, a vertically oriented select device and a global bit line.
Figure 8A:
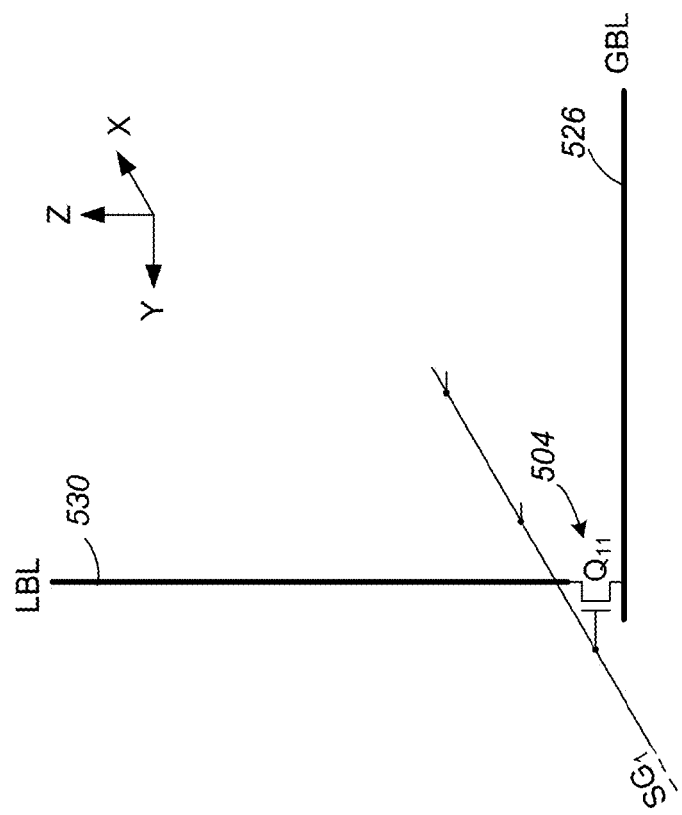
FIG. 8A is a schematic that depicts a vertical bit line, a vertically oriented select device and a global bit line.

FIG. 8A illustrates a schematic circuit diagram of a given multiple junction vertically oriented TFT select device switching a local bit line to a global bit line. In the example, the local bit line LBL 530 is switchable to the global bit line GBL 526 by a multiple junction vertically oriented TFT select transistor 504 such as $Q_{11}$. The gate of the TFT select transistor $Q_{11}$ is controllable by a signal exerted on a row select line $SG_1$.

FIG. 8B illustrates the structure of the multiple junction vertically oriented TFT select device in relation to the local bit line and the global bit line. The global bit line such as GBL 526 is formed below the multiple junction vertically oriented TFT select device, in the FEOL as part of the metal layer-1 or metal layer-2 502. The multiple junction vertically oriented TFT select device is formed in the BEOL layer on top of the GBL 526 (and above, but not in, the substrate). The local bit line LBL 530, in the form of a pillar, is formed on top of the vertically oriented select device 504. In this way, the multiple junction vertically oriented TFT select device 504 can switch the local bit line pillar LBL to the global bit line GBL.

Figure 9:
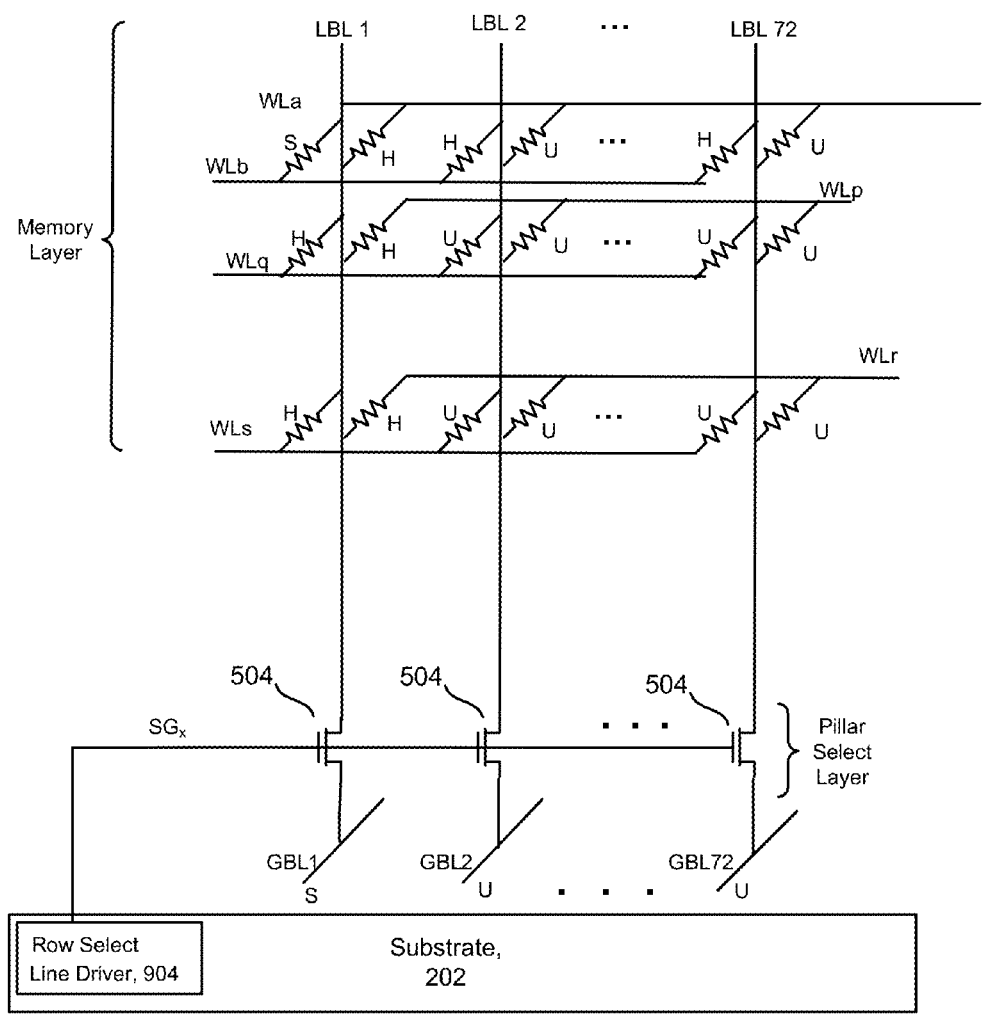
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the substrate 202. Only a portion of the Memory Layer is illustrated. For example, FIG. 9 shows bit lines LBL1, LBL2, ... LBL72. In this embodiment each of the word lines are connected to 72 memory elements. Each of the memory elements is connected between a word line and a bit line. Therefore, there will be 72 memory elements connected to the same word line and different bit lines (of the 72 bit lines in a row). Each of the bit lines are connected to a respective global bit line by one of the vertically oriented TFT select devices 504 of the Pillar Select Layer. The signal $SG_x$ driving the set of multiple junction vertically oriented TFT select devices 504 depicted in FIG. 9 is controlled by the Row Select Line Driver 904. Note that the Row Select Line Driver 904 is implemented in the substrate 202. The global bit lines (GBL1, GBL2, ... GBL72) are implemented in the metal lines above the substrate 202. FIG. 9 shows one slice taken along the word line direction such that each of the bit lines depicted in FIG. 9 are connected to different global bit lines via the vertically oriented TFT select devices 504.

In one embodiment, pairs of neighboring word lines (e.g., WLa and WLb, WLp and WLq, WLr and WLs) will be connected to memory elements that are in turn connected to common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such a that word line WLb is selected for memory operation while word lines WLa, WLp, WLq, WLr and WLs are not selected. Although the enabling signal applied on row select line SGx causes all of the vertically oriented TFT select devices 504 to connect the respective global bit lines to the respective local bit lines of FIG. 9, only the global bit line GLBL1 includes a data value for programming (as noted by the S). Global bit lines GLBL2 and GLBL72 do not include data for programming (as noted by the U). This can be due to the data pattern being stored as the global bit lines receive data dependent signals. Note that while SGx receive an enable signal, other select lines receive a disable signal to turn off the connected select devices.

Because local bit line LBL 1 and word line WLb are both selected for programming, the memory element between local bit line LBL1 and word line WLb is selected for the memory operation (as noted by the S). Since local bit line LBL1 is the only bit line with program data, the other memory elements connected to WLb will be half selected (as noted by H). By half selected, it is meant that one of the control lines (either the bit line or the word line) is selected but the other control line is not selected. A half selected memory element will not undergo the memory operation. The word line WLa is not selected; therefore, the memory cell between WLa and local bit line LBL1 is half selected, and the other memory elements on WLa are unselected. Since word lines WLp, WLq, WLr and WLs are not selected, their memory elements connected to LBL1 are half selected and the other memory elements connected to those word lines are unselected.

Figure 10:
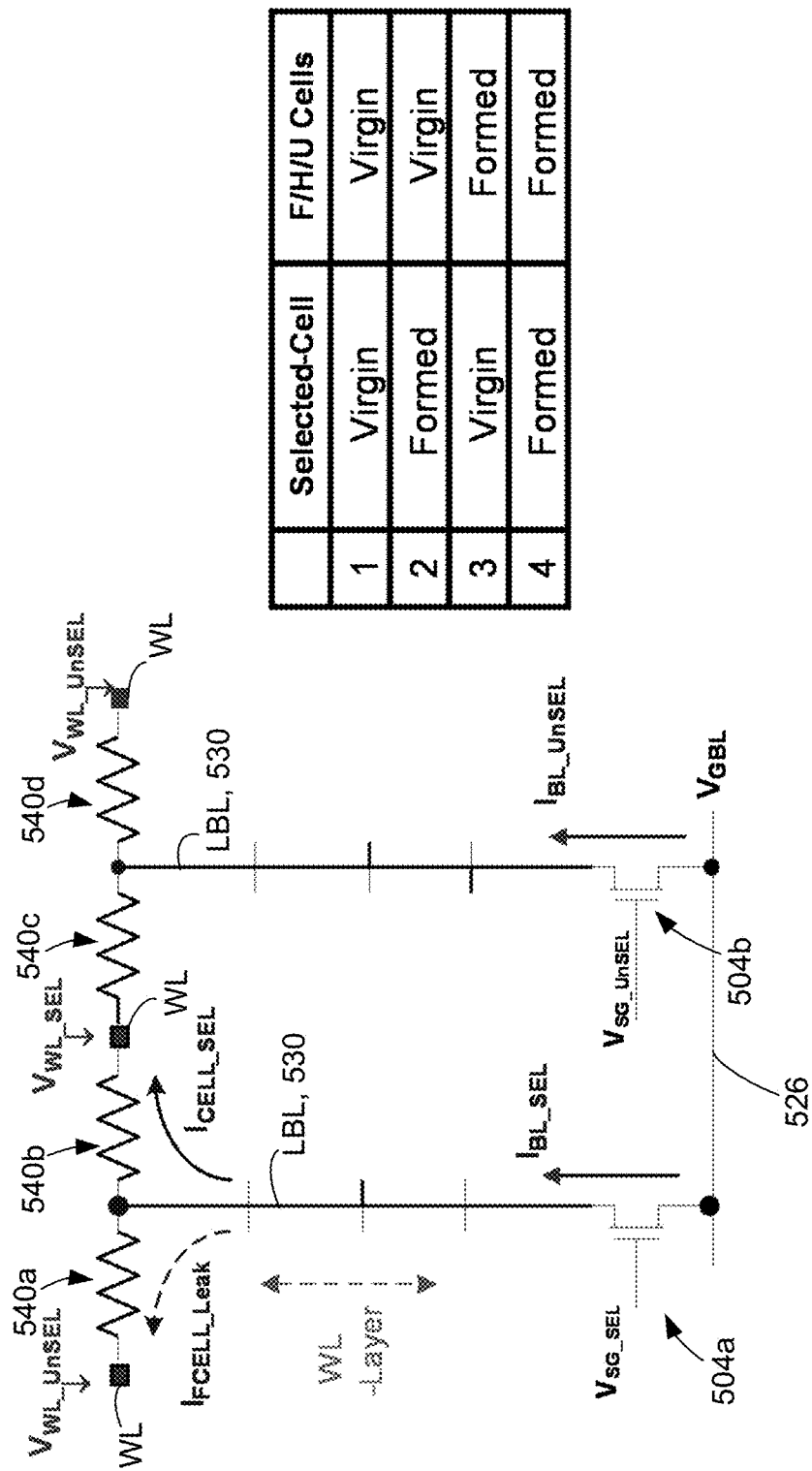
FIG. 10 is a schematic diagram to illustrate some of the concerns pertaining to a TFT selection device.

FIG. 10 is a schematic diagram to illustrate some of the concerns pertaining to a multiple junction vertically oriented TFT selection device. This example will discuss concerns when forming memory elements. Two vertical TFT selection devices 504a, 540b are shown connected between a global bit line 526 and the vertically oriented local bit lines 530. The vertical TFT selection device 504a on the left has a select voltage ($V_{SG\_SEL}$) applied to its gate (e.g., to turn it on). The vertical TFT selection device 504b on the right has an unselect voltage ($V_{SG\_UnSEL}$) applied to its gate (e.g., to keep it off).

A voltage $V_{GBL}$ is applied to the global bit line. Three word lines (WL) are represented. A select voltage ($V_{WL\_SEL}$) is applied to the selected word line in the middle. An unselect voltage ($V_{WL\_UnSEL}$) is applied to the other two word lines.

There are four memory elements 540a-540d, each represented by a resistor. Each memory element 540 is connected between a local bit line (LBL) and a word line (WL). The table in FIG. 10 indicates that there may be a selected cell and three different types of unselected memory cells (F, H, U). The three different types of unselected memory cells refers to the different voltages that are applied between their bit lines and their word line.

Memory element 540a is between the selected bit line and an unselected word line. The current $I_{FCELL\_Leak}$ is shown to represent a leakage current. This is an "F" cell.

Memory element 540b is between the selected bit line and the selected word line. Thus, this is the memory element 540b undergoing forming. The current $I_{CELL\_SEL}$ is shown to represent the current though the select memory cell. Note that the resistance of the selected memory typically drops sharply during forming. For example, it could drop from 1 G Ohm to 4 M Ohm, for some types of memory elements.

Memory element 540c is between the unselected bit line and the selected word line. This is an "H" cell. Memory element 540d is between the unselected bit line and the other unselected word line. This is a "U" cell.

In one embodiment, the forming operation is what is referred to herein as "forward forming." Example voltages for this forming operation are: $V_{GBL}$=about 3V to 6V; $V_{SG\_SEL}$=about 3.5V to 5.5V; $V_{SG\_UnSEL}$=about 0V or $V_{SG\_SEL}$-4V; $V_{WL\_SEL}$=about 0V; $V_{WL\_UnSEL}$=about 2V. Note that VWL UnSEL may be equal to about the voltage of the unselected bit line. Note that the global bit line is a high voltage and the selected word line is a low voltage. By convention, this is referred to as forward forming.

In one embodiment, the forming operation is what is referred to herein as "reverse forming." Example voltages for this reverse forming operation are: $V_{GBL}$=about 0V; $V_{SG\_SEL}$=about 0.5V to 2.5V; $V_{SG\_UnSEL}$=about 0V; $V_{WL\_SEL}$=about 4V to 5V; $V_{WL\_UnSEL}$ about 2.3V. Note that $V_{WL\_UnSEL}$ may be equal to about the voltage of the unselected bit line. Note that the global bit line is a low voltage and the selected word line is a high voltage. By convention, this is referred to as a reverse forming.

During the forming operation, the TFT 504 may be put under significant stress, wherein breakdown may occur. It may be that the pn junction between the body and the source/drain connected to the local bit line 530 is under greater stress for the reverse forming operation, and that the pn junction between the body and the source/drain connected to the global bit line 526 is under greater stress for the forward forming operation. Regardless of whether forward or reverse forming is used, the multiple junction TFT 504 of one embodiment has a high breakdown voltage. Therefore, breakdown of the multiple junction TFT 504 during a forming operation is reduced or eliminated.

Figure 11A:
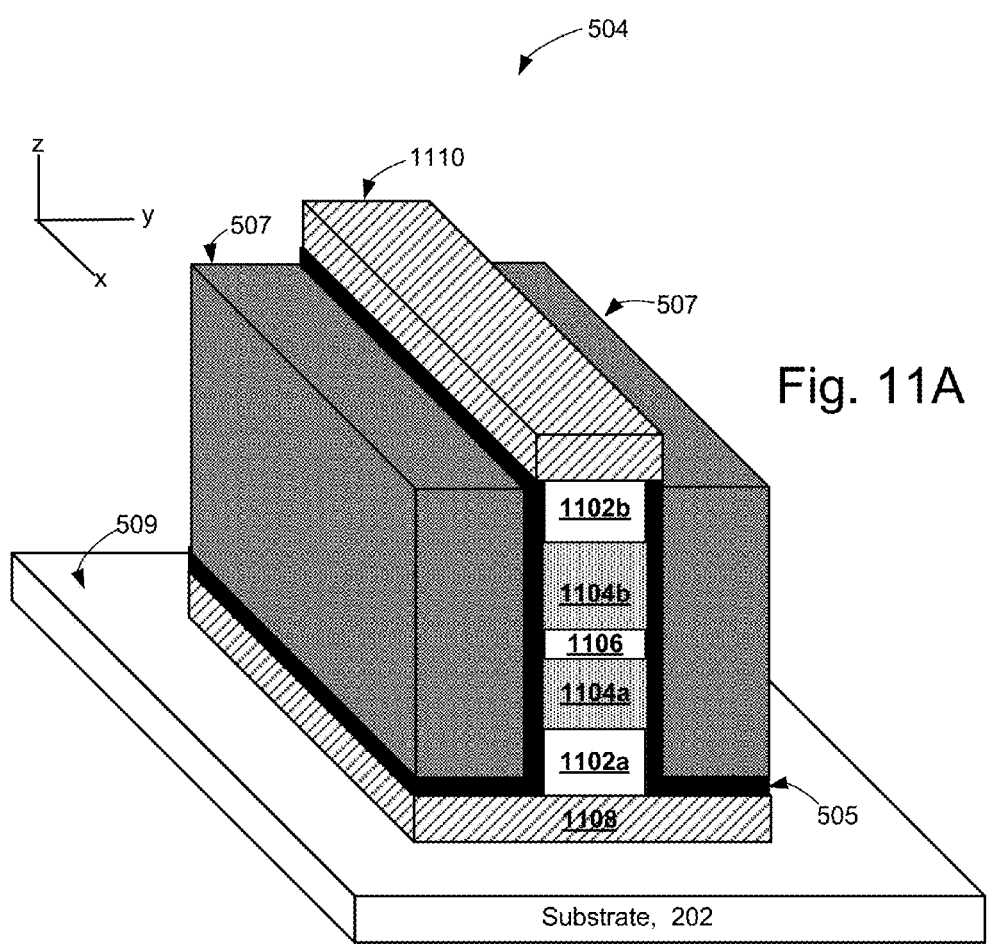
FIGS. 11A and 11B depict various embodiments of vertical TFT selection devices.
Figure 11B:
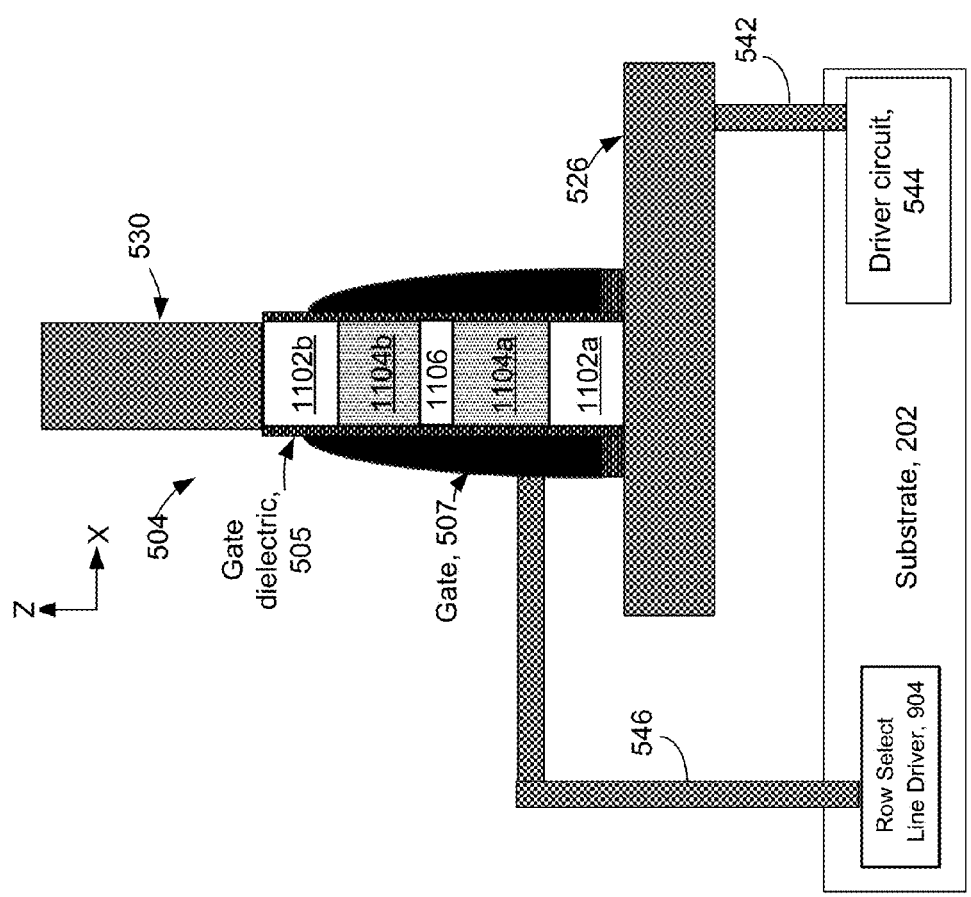

FIGS. 11A-11B depict various embodiments of vertical TFT selection devices 504. FIG. 11A is a diagram of one embodiment of a multiple junction vertical TFT selection device 504. The TFT 504 has at least one gate 507, first source/drain 1102a, second source drain 1102b, first body region 1104b, second body region 1106, third body region 1104b, and gate dielectric 505. For purposes of discussion, the first body region 1104b, the second body region 1106, and the third body region 1104b will be referred to as the "body" of the TFT 504. Thus, the first source/drain 1102a and the second source drain 1102b will not be referred to as being part of the body of the TFT 504. Instead, the first source/drain 1102a and the second source drain 1102b will be referred to as being adjacent to the body of the TFT. In other words, the body of the TFT 504 will be referred to as being between the first source/drain 1102a and the second source drain 1102b.

The first source/drain 1102a is in electrical contact with first conductive region 1108. The second source/drain 1102b is in electrical contact with second conductive region 1110. First and second conductive regions 1108, 1110 may be formed from a wide variety of conductors, including but not limited to, heavily doped polysilicon, tungsten, copper, or aluminum.

The vertical TFT selection device 504 has two gates 507 in this embodiment. However, the vertical TFT selection device 504 could have a single gate. The gate 507 may also be referred to as a "control gate". The gate dielectric 505 separates the gates 507 from either the body or the source/drain, as the case may be. The gate(s) 507 are connected to management circuitry, which provides control signals to the gate 507, in one embodiment. The control signals may be configured to turn the TFT 504 on or off. Therefore, the TFT 504 can be used to electrically connect or disconnect the two conductive regions 1108, 1110 to/from each other.

The TFT 504 is positioned above a substrate 202. The substrate 202 has a major surface 509 that extends in the xy-plane. The substrate 202 may be formed from a semiconductor wafer, as one example. For example, the substrate 202 may be formed from silicon, germanium, etc. The substrate 202 can have circuitry such as transistors formed within it.

The TFT is referred to as a vertically oriented TFT because of the orientation of regions 1102a, 1104a, 1106, 1104b, and 1102b with respect to the major surface 509 of the substrate 202. That is, the first source/drain 1102a, the three body regions 1104a, 1106, 1104b, and the second source/drain 1102b are aligned with each other vertically with respect to the major surface 509 of the substrate 202. The first conductive region 1108 does not necessarily reside in direct contact with the substrate 202. In one embodiment, a metal line (not depicted in FIG. 11A) electrically connects the first conductive region 1108 to circuitry in the substrate 202.

One of the conductive regions 1108, 1110 may be electrically connected to an element, such as a memory cell. The other conductive region may be electrically connected to a driver that provides a voltage. For example, conductive region 1110 might be a bit line that is electrically connected to one or more memory cells. In this example, conductive region 1108 may be electrically connected to a driver circuit (possibly, but not necessarily, located in substrate 202) that provides a voltage. Thus, the TFT 504 be used to provide the voltage to the element, such as a memory cell.

The first source/drain 1102a and the second source/drain 1102b each have a first type of electrical conductivity. Likewise, the second body region 1106 has the first type of electrical conductivity. The first body region 1104a and the second body region 1104b each have a second type of conductivity that is opposite first type of conductivity. For example, the TFT 504 may be an n/p/n/p/n device or a p/n/p/n/p device with respect to the five regions being presently discussed. The TFT 504 may also be referred to as multiple junction device. This is in reference to four pn junctions in this embodiment.

In one embodiment, the peak doping concentration of the second body region 1106 is greater than the peak doping concentration of the first body region 1104a. Likewise, the peak doping concentration of the second body region 1106 is greater than the peak doping concentration of the third body region 1104b, in the present embodiment. In one embodiment, the three body regions 1104a, 1106, 1104b are p−/n+/p−, respectively. In one embodiment, the three body regions 1104a, 1106, 1104b are n−/p+/n−, respectively. As one example, the peak doping concentration of the first body region 1104a and the third body region 1104b might be about $1\times10^{18}/cm^3$. The peak doping concentration of the second body region 1106 might range from $1\times10^{19}/cm^3$ to $1\times10^{21}/cm^3$. Thus, the second body region 1106 may have a peak doping concentration that ranges from 10 times to 1000 times the peak doping concentration of the first body region 1104a and the third body region 1104b.

The peak doping concentration, as well as the thickness of the second body region 1106 can be tuned to impact performance of the TFT, as well be discussed below. Example thicknesses for the second body region 1106 range from 50 nanometers (nm) to 120 nm. However, the second body region 1106 can be thinner than 50 nm or thicker than 120 nm.

In one embodiment, the peak doping concentration of the first source/drain 1102a is greater than the peak doping concentration of the first body region 1104a. In one embodiment, the peak doping concentration of the second source/drain 1102b is greater than the peak doping concentration of the second body region 1104b. The peak doping concentration of the first source/drain 1102a and the second source/drain 1102b might range from $1\times10^{19}/cm^3$ to $1\times10^{21}/cm^3$. Thus, the first source/drain 1102a and the second source/drain 1102b may have a peak doping concentration that ranges from 10 times to 1000 times the peak doping concentration of the first body region 1104a and the third body region 1104b. In one embodiment, the five regions 1102a, 1104a, 1106, 1104b, 1102b are p+/n−/p+/n−/p+, respectively. In one embodiment, the five regions 1102a, 1104a, 1106, 1104b, 1102b are n+/p−/n+/p−/n+, respectively.

The five regions 1102a, 1104a, 1106, 1104b, 1102b are formed from a semiconductor. Example semiconductors include, but are not limited to silicon and germanium. The gate 507 is formed from a conductive material. The gate 507 could be formed from materials including, but not limited to, titanium nitride, tungsten, and heavily doped polysilicon. The gate dielectric 505 could be formed from a wide variety of dielectrics including, but not limited to, silicon oxide.

The TFT 504 has good high voltage operation. The TFT 504 is able to withstand high voltage differences between its two source/drain regions 1102a, 1102b. For some operations, a relatively high voltage difference results between the two source/drain regions 1102a, 1102b. It is important that the vertically oriented TFT select device 504 does not breakdown. The second body region 1106 improves the TFT operation by, for example, improving breakdown voltage.

FIG. 11B is another embodiment of a multiple junction TFT 504. In this embodiment, the TFT 504 is used as a selection device for a memory device with a global bit line 526 and a local vertical bit line 530, such as discussed above. In this embodiment, a driver circuit 544 in the substrate 202 is electrically connected to the global bit line 526 by a metal interconnect 542. The driver circuit 544 supplies voltages to the global bit line 526, which may be passed to the local bit line 530 by the TFT 504. The gate 507 of the TFT 504 may be controlled by a row select line driver 904, which is electrically connected to the gate 507 by metal interconnect 546. The local bit line 530 may be electrically connected to memory cells (not depicted in FIG. 11A), as described elsewhere herein. Note that a portion of the driver circuit 544 and the row select line driver 904 may reside above or on the surface of the substrate 202. For example, control gates of transistors might be formed on a silicon substrate with the silicon substrate serving as the body of the transistor.

In the embodiment of FIG. 11B, the vertical bit line 530 corresponds to the second conductive region 1110 in the embodiment of FIG. 11A. Different reference numerals are used to emphasize that the second conductive region 1110 is not limited to being a vertical bit line 530. In the embodiment of FIG. 11B, the global line 526 corresponds to the first conductive region 1108 in the embodiment of FIG. 11A. Different reference numerals are used to emphasize that the first conductive region 1108 is not limited to being a global bit line 526.

FIG. 12A is a graph that depicts an affect that one embodiment of the second body region 1106 has on the electric field (e-field) of the TFT 504. The graph shows a first curve 1202 for one embodiment of the multiple junction TFT 504 having regions 1102a, 1104a, 1106, 1104b, and 1102b. The graph shows a second curve 1204 for a TFT that is similar without a second body region 1106, for the purpose of comparison. In this example, the horizontal axis is labeled with "Source" and "Drain" to indicate the location of the source and drain for each TFT. The locations of the pn junctions are not depicted in FIG. 12A. In this example, since the TFT is being operated, one of the source/drains functions as the source and the other source/drain functions as the drain. Either the first source/drain 1102a or the second source/drain 1102b can act as the source. Likewise for the drain.

Curve 1204 shows that there is a single peak in the e-field. This peak roughly corresponds to the pn junction near the drain of the TFT.

Curve 1202 shows that there are two peaks in the e-field for this embodiment of the TFT 504. One peak roughly corresponds to the pn junction near the drain of the TFT 504. Note that this peak is lower than the corresponding peak for curve 1204. There is a second peak on curve 1202, which roughly corresponds to the location of the second body region 1106. However, note that this peak is much lower than the other peaks.

FIG. 12B shows curves of impact ionization rate versus location along the channel of one embodiment of the two TFTs discussed with respect to FIG. 12A. Curve 1206 is for the TFT without the second body region 1106. Curve 1208 is for one embodiment of the TFT with the second body region 1106. Again the location of the source and drain are roughly depicted.

The curve 1206 for the TFT without the second body region 1106 shows that there is a single peak for impact ionization rate. As with the example of FIG. 12A, this peak is near the pn junction by the drain. Note that this is a very large peak.

The curve 1208 for the TFT for one embodiment of the TFT with the second body region 1106 shows that there are two peaks for impact ionization rate. As with the example of FIG. 12A, one peak is near the pn junction by the drain, and the other peak is near the second body region 1106. Note that the impact ionization rate is much lower for this embodiment of the TFT with the second body region 1106. Both peaks in impact ionization rate are much lower than the peak for the curve 1208.

A consequence of the reduction in the e-field and the reduction in the impact ionization rate is an increase in the breakdown voltage for this embodiment of the multiple junction TFT 504.

The thickness of the second body region 1106 may have an impact of the performance of the TFT 504. Likewise, the peak impurity concentration in the second body region 1106 have an impact of the performance of the TFT 504. Each of this will now be discussed.

FIG. 13A is a graph that shows doping concentration versus position for embodiments of a multiple junction TFT 504. The TFT 504 has similar regions 1102a, 1104a, 1106, 1104b, 1102b as those in the embodiments of FIGS. 11A and 11B. Each device has the same peak doping concentration in the second body region 1106. The variable is the thickness of the second body region 1106. Curve 1302 is for a TFT with the thinnest second body region 1106 of the three examples. Curve 1304 is for a TFT with the second body region 1106 having a medium thickness relative to the other examples. Curve 1306 is for a TFT with the second body region 1106 having the thickness second body region 1106. Example thicknesses for the three TFTs are 50 nanometers (nm), 80 nm, and 120 nm, respectively.

The horizontal axis has labels for the source and drain regions, which are in the same location for each of the three TFTs 504. The location of the second body region 1106 is roughly depicted. The second body region is centered at the same position for all three TFTs 504, but has a different thickness as just described. The location of the first and third body regions is not depicted in FIG. 13A.

The peak doping concentration in the second body region is the same for all three examples in FIG. 13A. An example peak doping concentration could be about $2 \times 10^{21}/cm^3$. However, the peak doping concentration could be higher or lower.

FIG. 13B is a graph that shows the e-field versus position for to show the effect of the thickness of the second body region 1106 for the embodiments of FIG. 13A. Curve 1312 corresponds to the thinnest second body region 1106. Curve 1314 corresponds to the medium thickness second body region 1106. Curve 1316 corresponds to the thickest second body region 1106 of the three examples.

Curve 1316 exhibits a higher peak near the drain than the other curves 1312, 1314. With an increase to the peak e-field near the drain, there is a decrease in the breakdown voltage. Thus, the TFT with the thickest second body region 1106 has a lower breakdown voltage than the other two examples TFTs.

There is also a fair amount of variance in the peak e-field between the second body region 1106 and the source. This peak e-field is the greatest for the TFT having the thickest second body region 1106 (as depicted by curve 1316). Conversely, the peak e-field between the second body region 1106 and the source is the least for the TFT having the thinnest second body region 1106 (as depicted by curve 1312).

Note that the e-field is near zero in the source and drain regions, for all three cases. Also, note that there is a flat region in which the e-field is near zero between the two peaks in the e-field (for all three cases). Additionally, note that the e-field is pushed outwards for the thicker case. Referring to the peaks left of the second body region 1106, curve 1316 has its peak more towards the source than the other two curves 1312, 1314. Also, curve 1312 has its peak more towards the drain than the other two curves 1314, 1316. Similar, referring to the peaks near the drain, curve 1316 may be shifted more towards the drain than the other two curves 1312, 1314. Also, curve 1312 may be shifted more the least amount towards the drain of the three curves.

Figure 13C:
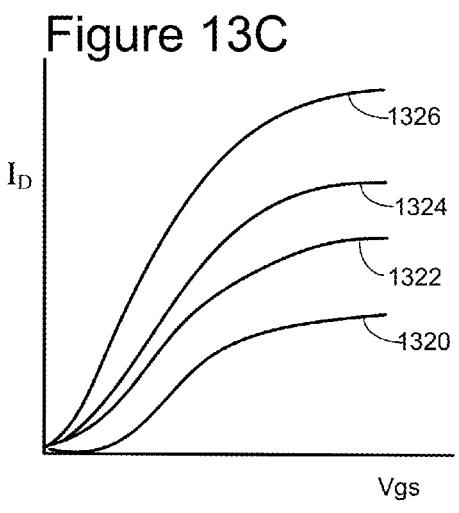
FIG. 13C is a graph that shows the drain current ($I_D$) versus the gate to source voltage (Vgs) to show the effect of the thickness of the second body region for the embodiments of FIG. 13A.

FIG. 13C is a graph that shows the drain current ($I_D$) versus the gate to source voltage (Vgs) to show the effect of the thickness of the second body region 1106 for the embodiments of FIG. 13A. Curve 1320 corresponds to a TFT that does not have the second body region 1106. Curve 1322 corresponds to the thinnest second body region 1106. Curve 1324 corresponds to the medium thickness second body region 1106. Curve 1326 corresponds to the thickest second body region 1106 of the three examples.

The curves in FIG. 13C show that the threshold voltage of the TFTs is lower when the second body region 1106 is thicker. Also, the TFT that does not have the second body region 1106 has the highest threshold voltage.

Figure 13E:
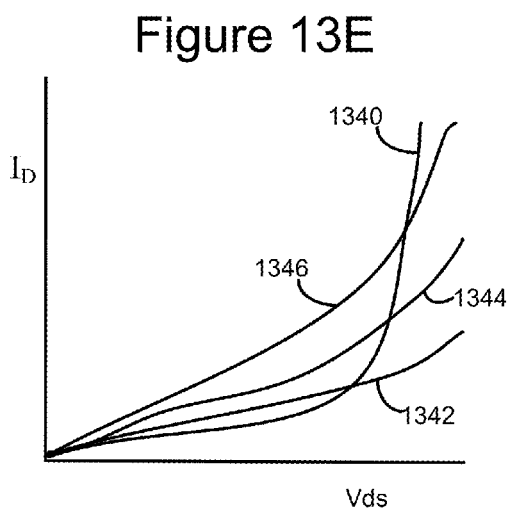
FIG. 13E is a graph that shows $I_D$ versus the drain to source voltage (Vds) to show the effect of the thickness one embodiment of the second body region on the drain current ($I_D$).
Figure 13D:
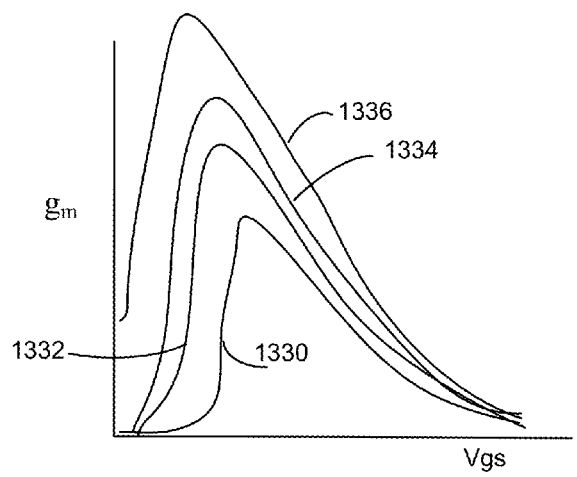
FIG. 13D is a graph that shows the trans-conductance ($g_m$) versus the gate to source voltage (Vgs) to show the effect of the thickness of one embodiment of the second body region on $g_m$.

FIG. 13D is a graph that shows the transconductance ($g_m$) versus the gate to source voltage (Vgs) to show the effect of the thickness of one embodiment of the second body region 1106 on $g_m$. Curve 1330 corresponds to a TFT that does not have the second body region 1106. Curve 1332 corresponds to the thinnest second body region 1106. Curve 1334 corresponds to the medium thickness second body region 1106. Curve 1336 corresponds to the thickest second body region 1106 of the three examples. The curves in FIG. 13D show that $g_m$ of the TFTs is higher when the second body region 1106 is thicker. Also, the TFT that does not have the second body region 1106 has the lowest $g_m$.

FIG. 13E is a graph that shows $I_D$ versus the drain to source voltage (Vds) to show the effect of the thickness of one embodiment of the second body region 1106 on the drain current ($I_D$). Curve 1340 corresponds to a TFT that does not have the second body region 1106. Curve 1342 corresponds to the thinnest second body region 1106. Curve 1344 corresponds to the medium thickness second body region 1106. Curve 1346 corresponds to the thickest second body region 1106 of the three examples. The curves in FIG. 13E show that for at least the lower values of Vds, $I_D$ of the TFTs is higher when the second body region 1106 is thicker. Also, the TFT that does not have the second body region 1106 has the lowest drain current, as least for lower values of Vds. However, curve 1340 (for the device without the second body region 1106) also shows a sharp increase in the drain current, which corresponds to TFT breakdown.

Figure 13F:
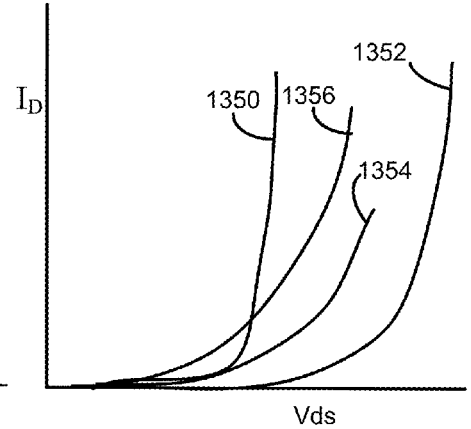
FIG. 13F is a graph that shows $I_D$ versus the drain to source voltage (Vds) to show the effect of the thickness one embodiment of the second body region on the breakdown voltage.

FIG. 13F is a graph that shows $I_D$ versus the drain to source voltage (Vds) to show the effect of the thickness of one embodiment of the second body region 1106 on the breakdown voltage. The values for Vds are higher in FIG. 13F than in 13E to be able to show the breakdown regions for all TFTs. Curve 1350 corresponds to a TFT that does not have the second body region 1106. Curve 1352 corresponds to the thinnest second body region 1106. Curve 1354 corresponds to the medium thickness second body region 1106. Curve 1356 corresponds to the thickest second body region 1106 of the three examples. The curves in FIG. 13F show that the breakdown voltage is higher when the second body region 1106 is thinner, for at least some range of thicknesses. Note that the TFT that does not have the second body region 1106 has the lowest breakdown voltage.

Figure 14A:
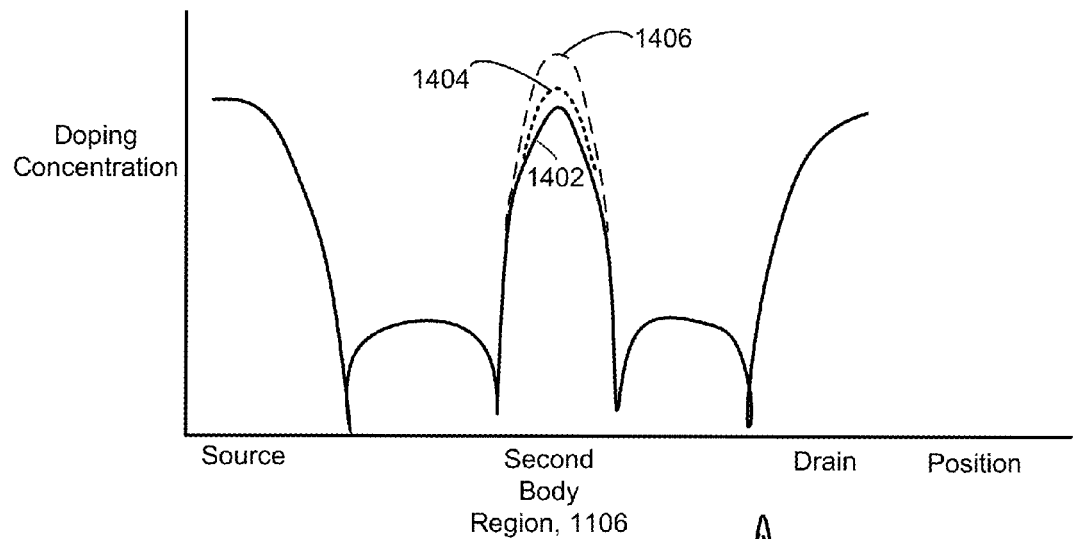
FIG. 14A is a graph depicting three example peak doping concentrations for the second body region.

As noted above, the peak doping concentration in the second body region 1106 may impact the performance of the TFT 504. FIG. 14A is a graph depicting three example peak doping concentrations for the second body region 1106. Curve 1402 has the lowest peak doping concentration, curve 1404 is in the middle, and curve 1406 has the highest peak doping concentration. An example of the peak doping concentrations could be $4 \times 10^{20}/cm^3$, $7 \times 10^{20}/cm^3$, and $2 \times 10^{21}/cm^3$. These peak doping concentrations are for the sake of illustration, each could be higher or lower.

Figure 14B:
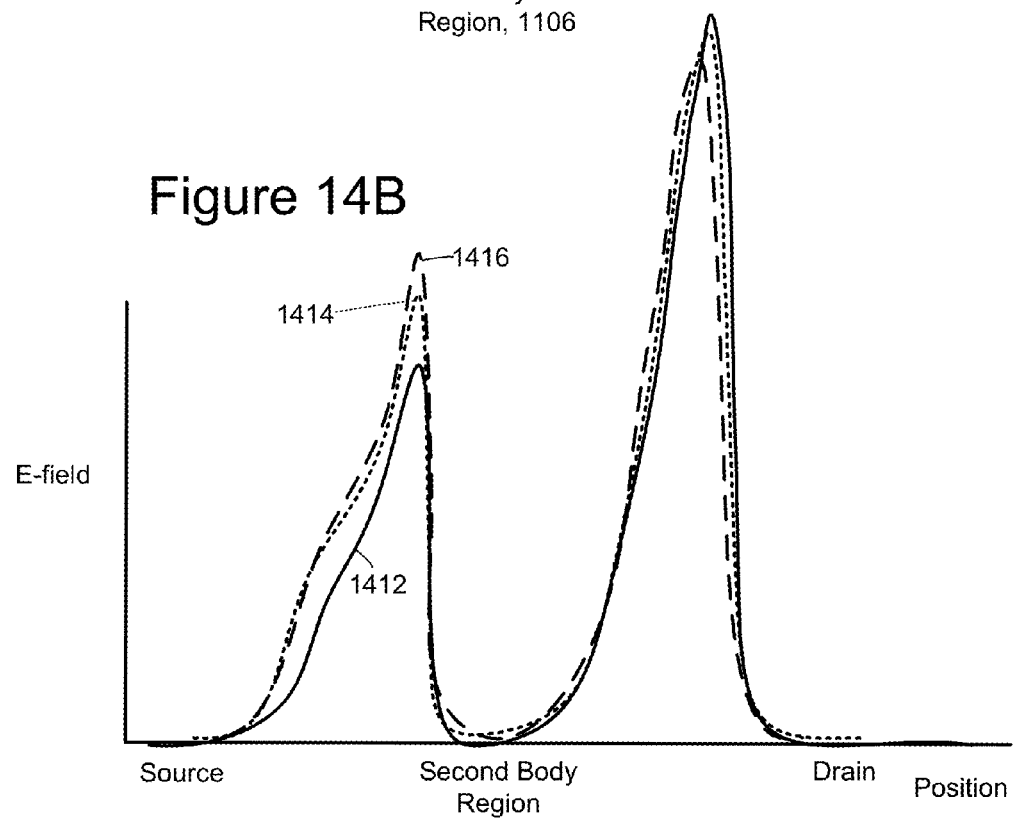
FIG. 14B is a graph depicting the e-field versus position to show the effect of the peak doping concentration of one embodiment of the second body region.

FIG. 14B is a graph depicting the e-field versus position to show the effect of the peak doping concentration of one embodiment of the second body region 1106. Curve 1412 corresponds to the lowest peak doping concentration. Curve 1414 corresponds to the medium peak doping concentration. Curve 1416 corresponds to the highest peak doping concentration.

An increase to the peak doping concentration results in a higher e-field for the peak nearest the source. That is, curve 1416 has a higher peak near the source than curve 1414, which has a higher peak near the source than curve 1412.

An increase to the peak doping concentration results in a lower e-field for the peak nearest the drain. That is, curve 1412 has a higher peak near the drain than curve 1414, which has a higher peak nearest the drain than curve 1416. Therefore, the higher peak doping concentration is more effective at reducing the e-field near the drain.

Figure 14C:
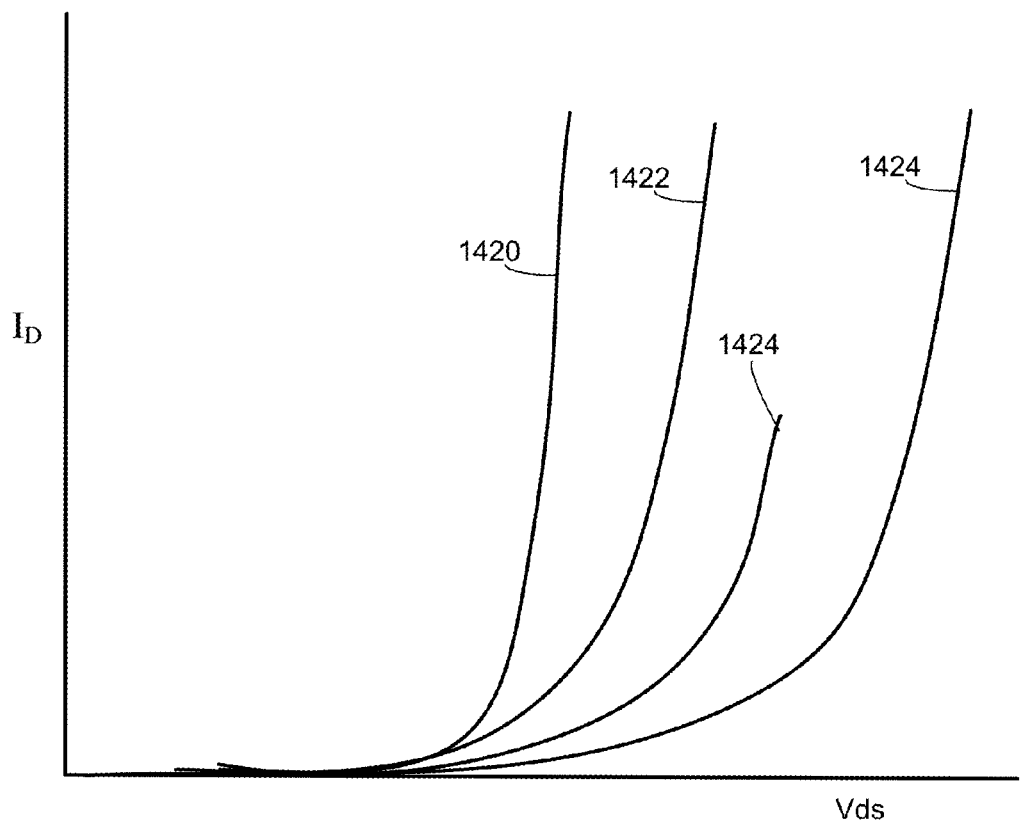
FIG. 14C is a graph depicting $I_D$ versus Vds to show the effect of the peak doping concentration of the one embodiment of the second body region on the breakdown voltage.

FIG. 14C is a graph depicting $I_D$ versus Vds to show the effect of the peak doping concentration of the one embodiment of the second body region 1106 on the breakdown voltage for some embodiments. Curve 1422 corresponds an embodiment of the TFT having the lowest peak doping concentration. Curve 1424 corresponds an embodiment of the TFT having a medium peak doping concentration. Curve 1426 corresponds an embodiment of the TFT having the highest peak doping concentration of the three. Curve 1420 corresponds to a TFT without the second body region 1106. The curves show that the higher the peak doping concentration in the second body region 1106, the higher the breakdown voltage.

FIG. 15A is a cross-sectional view of a memory structure using one embodiment of a multiple junction vertically oriented TFT select device 504 and the memory structure of FIG. 6.

The memory layer includes a set of vertical bit lines 530 (comprising n+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 534 and word line layers 536 are vertically oriented layers of reversible resistance switching material 532. In one embodiment, the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530.

Directly below each vertical bit line 530 are the vertically oriented TFT select devices 504, each of which comprises (in one example embodiment) an n+/p−/n+/p−/n+ TFT. As noted above, another alternative is a p+/n−/p+/n−/p+ TFT. In this case, a modification may be made to avoid having a pn junction between the TFT and the vertical bit line 530. The modification may include adding an additional layer between the TFT and the vertical bit line 530 or not using n+ doping for the vertical bit line 530.

Each of the vertically oriented TFT select devices 504 has dielectric layers 505 on each side. The dielectric layers 505 are oxide, in one embodiment. In this embodiment, each TFT has two gates. Referring to TFT 504*a*, there is a gate 507*a* to the left and a gate 507*b* to the right.

FIG. 15A also shows an optional n+ polysilicon layer 524. As can be seen, the vertically oriented TFT 504 can be used to connect the global bit line GBL (layer 526) with any of the vertical bit lines 530.

As described below, the memory structure of FIG. 15A is a continuous mesh array of memory elements because there are memory elements connected to both sides of the bit lines and memory elements connected to both sides of the word lines. At the bottom of FIG. 15A, the CMOS substrate 202 is depicted. Implemented on the top surface of the CMOS structure are various metal lines including ML-0, ML-1, and ML-2. Line 526 of ML-2 serves as a respective global bit line (GBL). The Pillar Select Layer includes two oxide layers 520, 521 with a gate material layer 522 sandwiched there between. The oxide layers 520, 521 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 1), which are labeled in FIG. 15A as row select lines 507. Portions of the row select lines may also be referred to a transistor gates.

FIG. 15A shows six row select lines ($SG_x$) 507 in the gate material layer 522, each underneath a stack of multiple word lines. As can be seen, each of the row select lines 507 is positioned between two vertically oriented select devices 504, above and not in the substrate. Therefore each row select line can serve as the gate signal to either of the two neighboring vertically oriented TFT select devices 504; therefore, the vertically oriented TFT select devices 504 are said to be double gated. Each vertically oriented TFT select device 504 can be controlled by two different row select lines, in this embodiment.

FIG. 15B is a cross-sectional view of another embodiment of a memory structure using the vertically oriented TFT select device 504 and the memory structure of FIG. 6. In this embodiment, the shape of the control gate is different from the example of FIG. 15A. The control gate 507 could surround the body of the TFT, as one possibility. However, in one embodiment, there is a separate control gate 507 on each of two vertical sides of the body of the TFT. Thus, the TFT may be double gated in one embodiment of the diagram of FIG. 15B.

Figure 16:
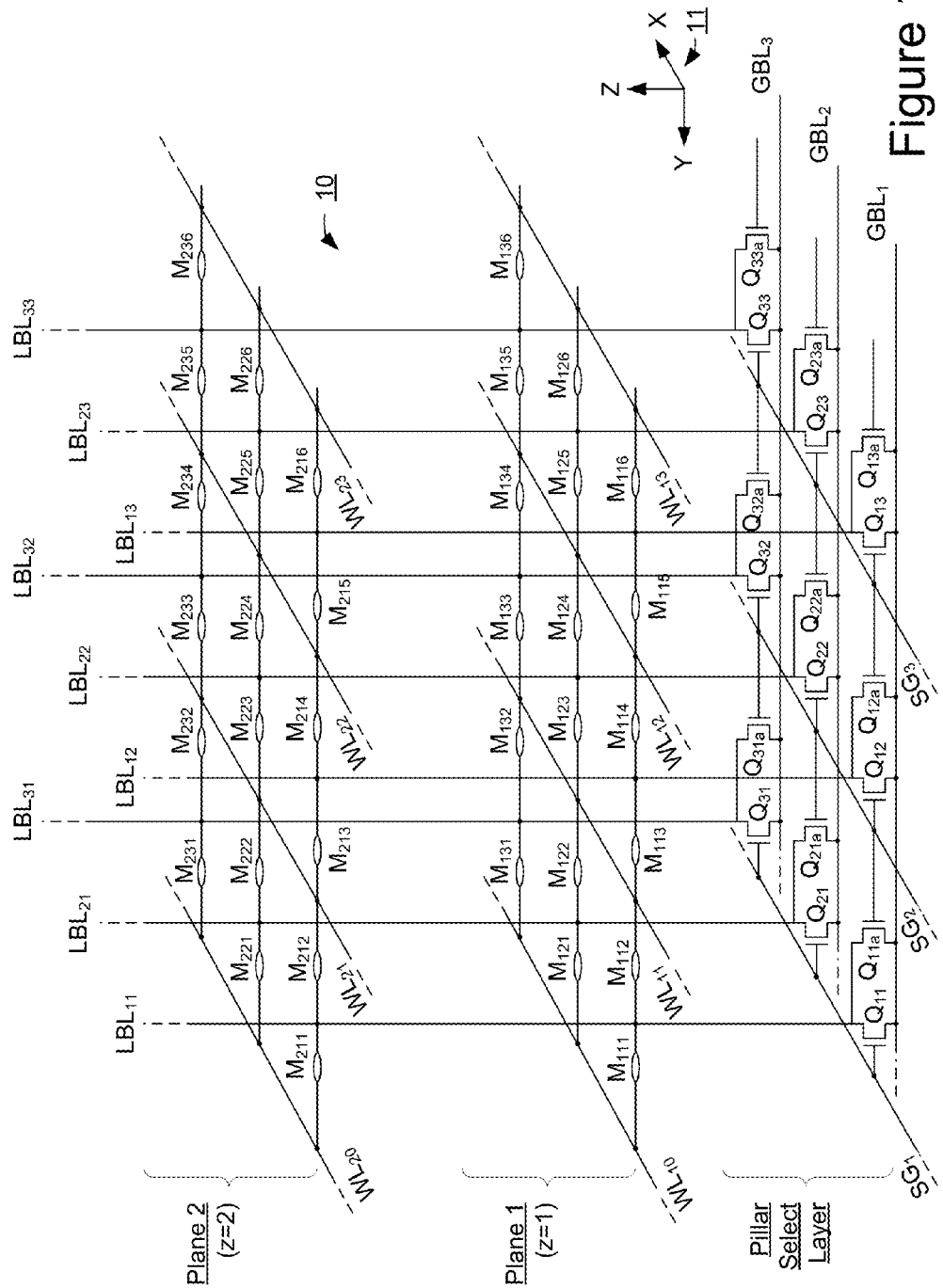
FIG. 16 is a partial schematic of the memory system of FIGS. 15A and 15B, depicting the above-described double-gated structure for the vertically oriented TFT select devices.

FIG. 16 is a partial schematic of the memory system of FIGS. 15A and 15B, depicting the above-described double-gated structure for the vertically oriented TFT select devices 504. Planes 1 and 2 of FIG. 16 are the same as in FIG. 1. As can be seen, each local bit line LBL is connectable to a respective global bit line GBL by two row select signals. FIG. 16 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 16.

Figure 17:
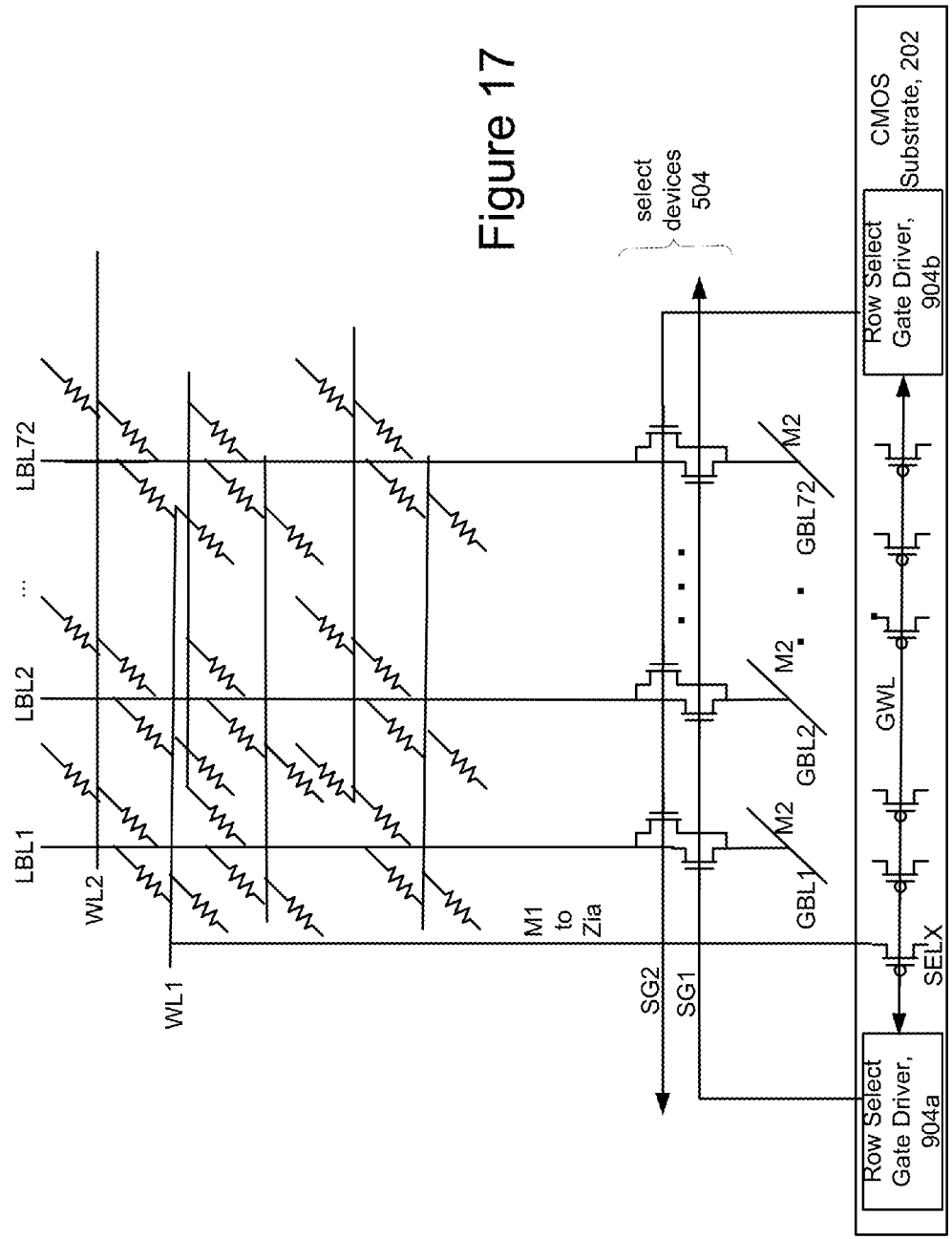
FIG. 17 shows another partial schematic also depicting one embodiment of the double-gated structure.

FIG. 17 shows another partial schematic also depicting one embodiment of the double-gated structure such that each local bit line (LBL1, LBL2, . . . LBL72) are connected to their respective global bit lines (GBL1, GBL2, . . . GBL72) by any of two respective vertically oriented TFT select devices that are positioned above the CMOS substrate. As can be seen, while the double-gated structure of FIGS. 15A and 15B include positioning the various select devices 504 above the substrate, the Row Select Line Drivers 904a, 904b providing the row select lines $SG_1$, $SG_2$, . . . are positioned in the substrate 202. Similarly, the global word lines (e.g., GWL) are position in a metal layer on the substrate and below the vertically oriented select devices. Furthermore, as will be explained below, in one embodiment the Row Select Line Driver uses the appropriate global word line GWL as an input.

Figure 18:
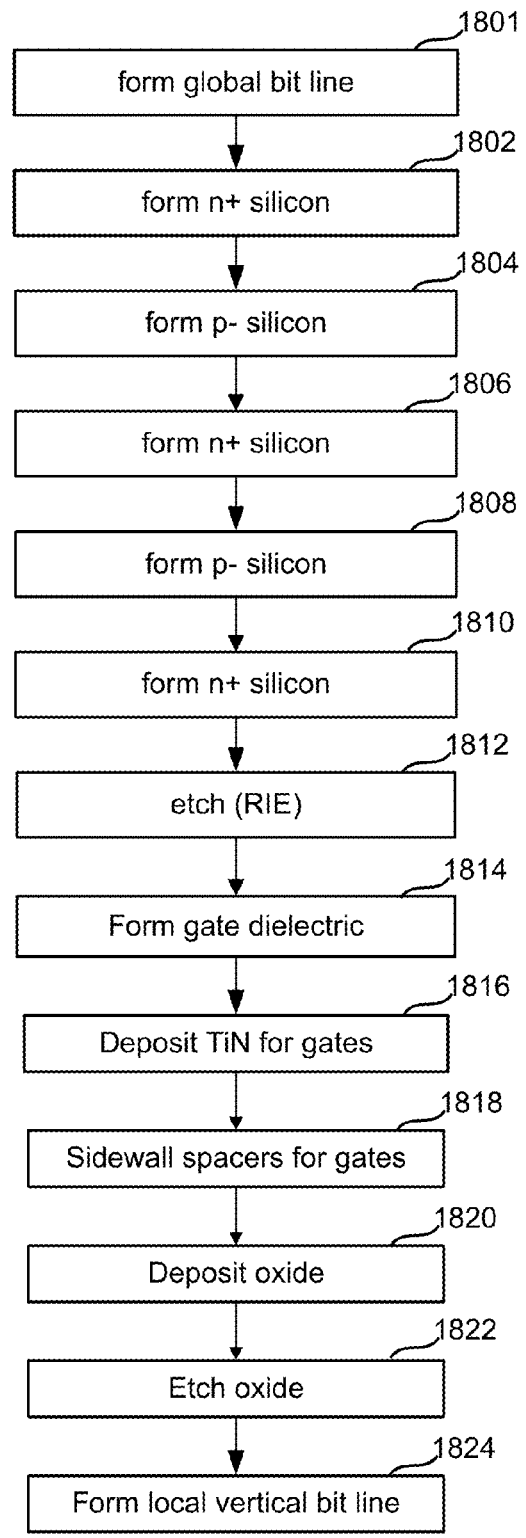
FIG. 18 is a flow chart describing one embodiment for manufacturing a Pillar Select Layer having a vertical TFT selected device.

FIG. 18 is a flow chart describing one embodiment for manufacturing a Pillar Select Layer having a vertical TFT selected device 504. FIGS. 19A-19E depict results after various steps of one embodiment of FIG. 18. This process may be used to form the Pillar Select Layer depicted in FIG. 15B. Note that other processes can be used form the vertical TFT selected device 504. In FIG. 18, the TFT is an embodiment that is n+/p−/n+/p−/n+. The process can be modified for other TFTs, such as, p+/n−/p+/n−/p+.

This process can be performed after manufacturing the metal layers and substrate layers (e.g., drivers and other logic), and before manufacturing the memory layer. The substrate layers, metal layers and memory layers can be manufactured using other processes known and/or described elsewhere. In step 1801, the global bit line is formed.

In steps 1802-1810, silicon that will form the basis for the source, body, and drain of the TFTs is deposited. The process can be modified by using a semiconductor other than silicon. Also, steps 1802-1810 describe a general formation process. In steps 1802-1810 layers of n+ silicon, p− silicon, n+ silicon, p− silicon, and n+ silicon are formed. The various layers of silicon may be doped in situ or an implant could be formed after depositing the silicon. Further details of variations of how the doping is achieved are discussed below. FIG. 19A depicts results after step 1810. FIG. 19A shows first n+ layer 1922 over the global bit line 526, first p− layer 1924 over the first n+ layer 1922, second n+ layer 1926 over the first p− layer 1924, second p− layer 1928 over the second n+ layer 1924, and third n+ layer 1930 over the second p− layer 1928. The example ranges of doping concentrations mentioned with respect to the discussion of FIG. 11A may be used in the process of FIG. 18. However, process 18 is not limited to those example ranges. As noted above, the doping concentration can be tuned for desired TFT performance.

Also, the thickness of the second body region 1106 can be tuned for desired TFT performance.

In step 1812 the layers of silicon are etched in a pattern that is suitable to form the source/drains and body regions. In step 1812, the form pillars for the vertical TFT select devices. FIG. 19B depicts results after step 1812, showing several pillars 1940. Each pillar 1940 has first source/drain region 1102a, first body region 1104a, second body region 1106, third body region 1104b, and second source/drain region 1102b.

In step 1814, a gate dielectric is formed. FIG. 19C depicts results after step 1814 showing the gate dielectric material 1942 over the pillars 1940. In one embodiment, the gate dielectric material 1942 is formed by ALD of silicon oxide. In one embodiment, the gate dielectric material 1942 is formed by ALD of hafnium oxide. In one embodiment, the gate dielectric material 1942 is thermally grown oxide. In one example implementation, the gate dielectric layer 1942 will be approximately 3 to 10 nanometers thick.

In step 1816, material is deposited for the gates. In one embodiment, TiN is deposited. In step 1818, the gate material is etched to form the gates. For example, reactive ion etching (RIE) is used. FIG. 19D depicts results after step 1818, showing gates 507 adjacent to the gate dielectric material. In this embodiment, each TFT has two gates 507. In another embodiment, a TFT has a single gate. In one embodiment, the TiN is deposited over the gate material in a more or less conformal layer. Etching back creates the structure of FIG. 19D.

Figure 19E:
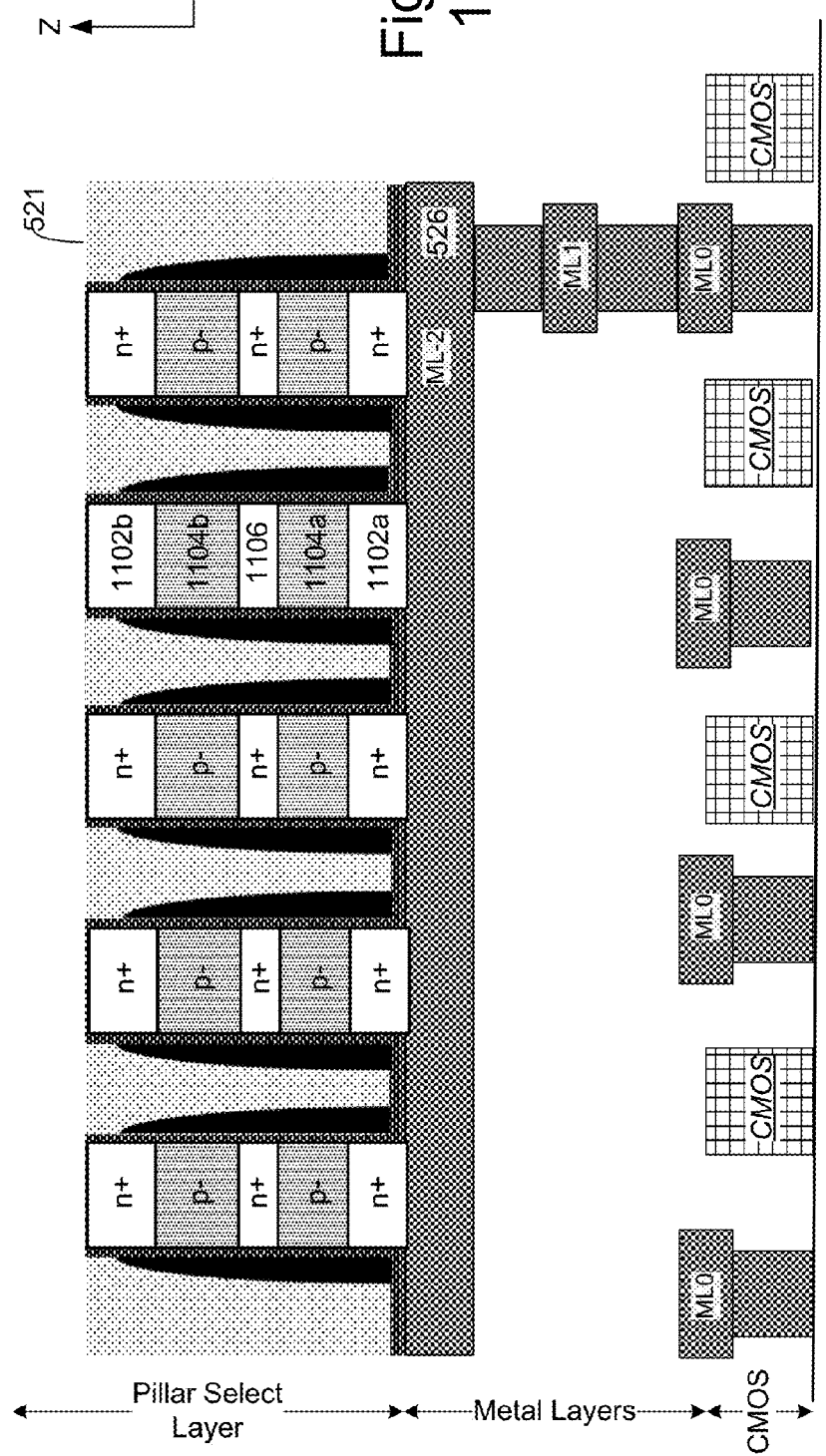

In step 1820, another layer of oxide is formed. In step 1822, the oxide is etched back. FIG. 19E depicts results after step 1822, showing upper oxide layer 521. For example, CVD can be used to deposit Sift. Note that the etching has also exposed the top surface of the second source/drain region, which was previously covered with the gate dielectric material.

Next, the vertical bit lines are formed in electrical contact with the second source/drain regions 1102b, in step 1824. The formation of the memory cells and word lines will not be discussed.

Figure 20A:
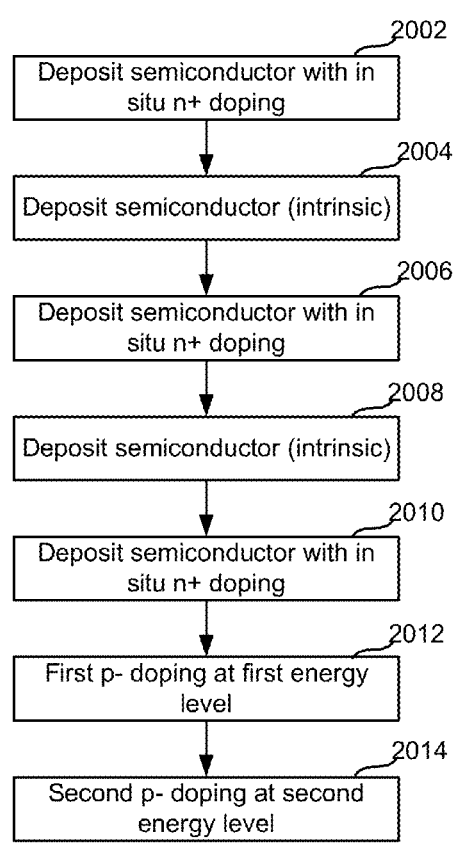
FIG. 20A is one embodiment of a process of doping the various silicon layers that form the source/drains and body of the TFT.

FIG. 20A is one embodiment of a process of doping the various silicon layers that form the source/drains and body of the TFT 504. This process is one embodiment of steps 1802-1810 of FIG. 18. FIGS. 20B-20C depict results after various steps of one embodiment of FIG. 20A. In step 2002, silicon is deposited with in situ n+ doping. In step 2004, silicon is deposited without intentionally doping (e.g., intrinsic). In step 2006, silicon is deposited with in situ n+ doping. In step 2008, silicon is deposited without intentionally doping (e.g., intrinsic). In step 2010, silicon is deposited with in situ n+ doping. Results are as depicted in FIG. 20B. FIG. 20B shows first n+ layer 2122 over the global bit line 526, first intrinsic layer 2124 over the first n+ layer 2122, second n+ layer 2126 over the first intrinsic layer 2124, second intrinsic layer 2128 over the second n+ layer 2124, and third n+ layer 2130 over the second intrinsic layer 2128.

In step 2012 a p-type donor is implanted using a first energy level. This energy level targets the first intrinsic layer 2124. Thus, it targets a relatively deep depth. In step 2014 a p-type donor is implanted using a second energy level. This energy level targets the second intrinsic layer 2128. Thus, it targets a relatively shallow depth. FIG. 20C roughly shows rough concentrations for the two step implant. The graph shows rough concentration levels for the various layers. Curve 2142 represents the impurity concentration and depth for the first implant step. Curve 2144 represents the impurity concentration and depth for the second implant step. Results after step 2014 are as depicted in FIG. 19A.

Figure 21A:
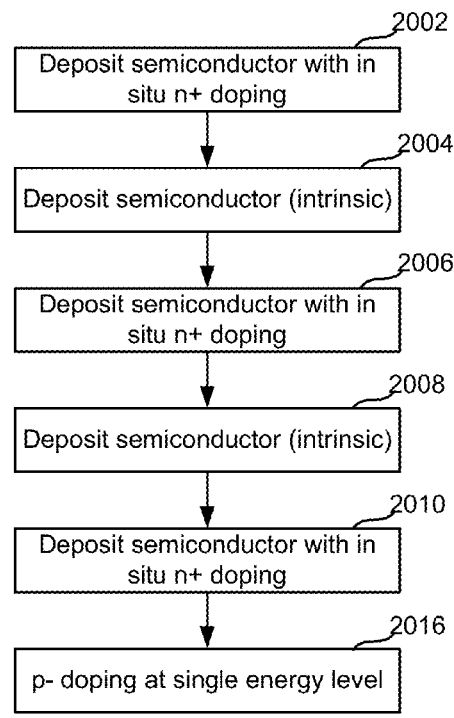
FIG. 21A is a flowchart of another embodiment for doping the various layers in the TFT 504.

An alternative to using two separate energy level implants in steps 2012 and 2014 is to use a single implant. This implant may use an energy level that is suitable to dope both the first intrinsic layer 2124 and the second intrinsic layer 2128. FIG. 21A is a flowchart of one such embodiment. Steps 2012 and 2014 are replaced by step 2016, which is implanting an impurity using a single energy level. FIG. 21B roughly shows rough concentrations for the one step implant. The graph shows rough concentration levels for the various layers. Curve 2146 represents the impurity concentration and depth for the single implant step. Results after step 2016 are as depicted in FIG. 19A.

Figure 22A:
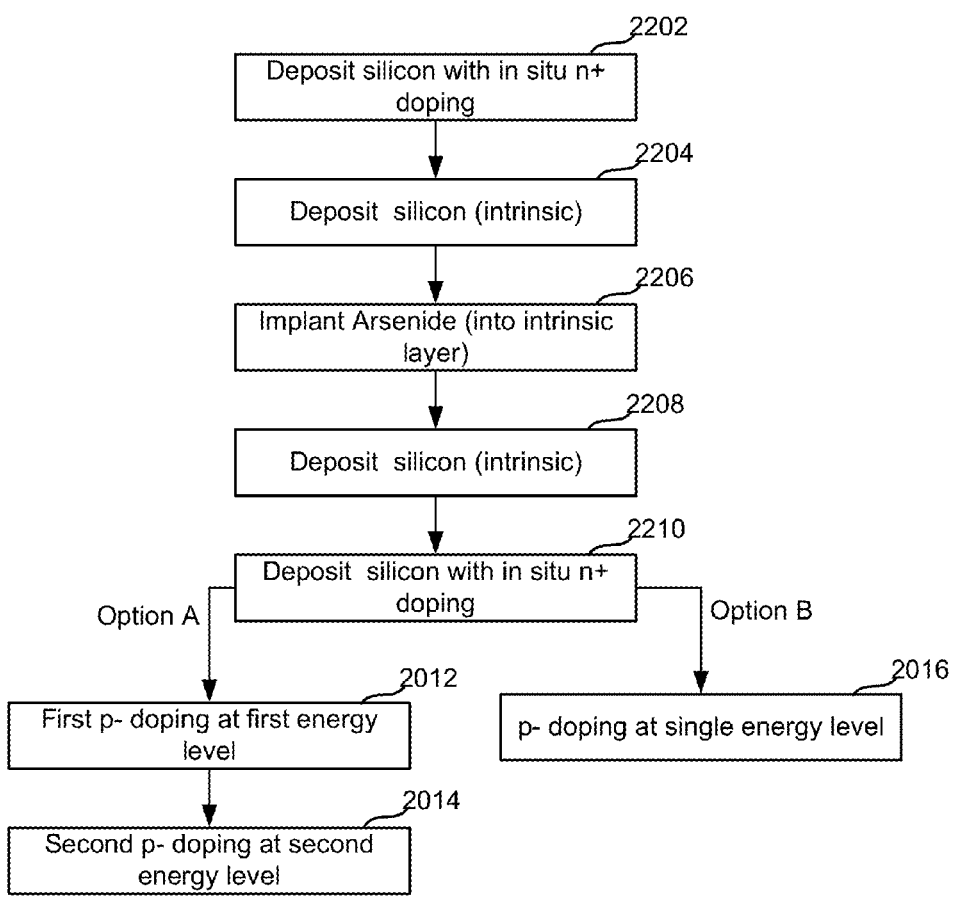
FIG. 22A is a flowchart of another embodiment for doping the various layers in the TFT.

FIG. 22A is a flowchart of another embodiment for doping the various layers in the TFT 504. In step 2202, silicon is deposited with in situ n+ doping. In step 2204 silicon is deposited without intentionally doping (intrinsic). Results after step 2204 are depicted in FIG. 22B. FIG. 22B depicts the CMOS structure, with metal layers MLO, ML1, and global bit line that have been previously discussed. The n+ silicon layer 2222 and the intrinsic layer 2224 are depicted.

In step 2206, arsenide is implanted at a shallow depth into the intrinsic layer. This creates a shallow n+ layer. Results after step 2206 are depicted in FIG. 22C. The arsenide implant has resulted in a thin n+ layer 2226 in what was the topmost portion of the intrinsic layer (the intrinsic layer is now labeled with reference numeral 2224a to indicate its modification).

In step 2208 another layer of silicon is deposited without intentionally doping (intrinsic). This is deposited over the thin n+ layer 2226. In step 2210, another layer of silicon is deposited with in situ n+ doping. This is deposited over the second intrinsic layer. Results after step 2210 are similar to FIG. 20B. Next the two intrinsic layers are doped. Option A is a two-step implant as previously described. Option B is a single-step implant as previously described.

The examples disclosed herein in which the multiple junction vertically oriented TFT 504 is used as a selection device in a 3D memory array having reversible resistivity memory cells is not the only architecture that the TFT 504 could be used within. The multiple junction vertically oriented TFT 504 depicted in, for example, FIG. 11A, could be used in other types of 3D memory arrays. For example, it could be used in a 3D memory array that has vertically oriented NAND strings. In this example, the multiple junction vertically oriented TFT 504 might be used connect/disconnect vertically oriented NAND strings from a common source line. Thus, conductor 1108 might be a common source line and conductor 1110 might be the channel of a vertically oriented NAND string. As another example, the multiple junction vertically oriented TFT 504 might be used connect/disconnect vertically oriented NAND strings from a bit line. In one embodiment, the multiple junction vertically oriented TFT 504 is used in a 3D memory array that used a "Bit Cost Scalable" (or BiCs) architecture. Additionally, the multiple-junction vertically oriented TFT 504 could be used other than in a memory array.

One embodiment includes a non-volatile storage system comprising a substrate having a major surface, a first conductive region, a second conductive region, a first source/drain having a first type of conductivity, a second source/drain having the first type of conductivity, and a body between the first source/drain and the second source/drain. The body comprises a first body region having a second type of conductivity that is opposite first type of conductivity, a second body region having the first type of conductivity, and a third body region having the second type of conductivity. The first source/drain is electrically connected to the first conductive region. The second source/drain is electrically connected to the second conductive region. The second body region is between the first body region and the third body region. A peak doping concentration of the second body region is greater than a peak doping concentration of the first body region and is greater than a peak doping concentration of the third body region. The first source/drain, the body, and the second source/drain are aligned with each other vertically with respect to the major surface of the substrate. Additionally there is a control gate adjacent to the body, and a management circuit coupled to the control gate. The management circuit is configured to apply a first signal to the control gate to electrically connect the first conductive region to the second conductive region and to apply a second signal to the control gate to electrically disconnect the first conductive region from the second conductive region.

One embodiment includes a method of fabricating a semiconductor device. The method comprises forming a first conductive line above a semiconductor substrate having a major surface that extends in a horizontal plane; forming a first semiconductor layer having a first peak doping concentration of a first type of conductivity, including forming the first semiconductor layer in electrical contact with the first conductive line; forming a second semiconductor layer having a second peak doping concentration of a second type of conductivity that is opposite the first type of conductivity, including forming the second semiconductor layer in electrical contact with the first semiconductor layer; forming a third semiconductor layer having a third peak doping concentration of the first type of conductivity, including forming the third semiconductor layer in electrical contact with the second semiconductor layer; forming a fourth semiconductor layer having a fourth peak doping concentration of the second type of conductivity, including forming the fourth semiconductor layer in electrical contact with the third semiconductor layer; forming a fifth semiconductor layer having a fifth peak doping concentration of the first type of conductivity, including forming the fifth semiconductor layer in electrical contact with the fourth semiconductor layer, wherein the first, second, third, fourth, and fifth semiconductor layers form a stack that extends in a vertical direction with respect to the horizontal plane, wherein the first, third and fifth peak doping concentrations are each greater than the second and fourth peak doping concentrations; forming a tunnel dielectric as a conformal layer on the first, second, third, fourth, and fifth semiconductor layers; forming a conductive control gate adjacent to the second, third, and fourth semiconductor layers with the tunnel dielectric between the conductive control gate and the second, third, and fourth semiconductor layers; and forming a second conductive line that extends in a vertical direction with respect to the horizontal plane, including forming the second conductive line in electrical contact with the fifth semiconductor layer.

One embodiment includes a semiconductor device, which comprises a semiconductor substrate having a major surface that extends in a horizontal plane; a first conductive line; a second conductive line that extends in a vertical direction with respect to the horizontal plane; a first semiconductor layer having a first peak doping concentration of a first type of conductivity, wherein the first semiconductor layer is electrically connected to the first conductive line; a second semiconductor layer having a second peak doping concentration of a second type of conductivity that is opposite the first type of conductivity; a third semiconductor layer having a third peak doping concentration of the first type of conductivity; a fourth semiconductor layer having a fourth peak doping concentration of the second type of conductivity; a fifth semiconductor layer having a fifth peak doping concentration of the first type of conductivity, wherein the fifth semiconductor layer is electrically connected to the second conductive line, wherein the first, second, third, fourth, and fifth semiconductor layers form a stack that extends in the vertical direction, wherein the first, third and fifth peak doping concentrations are each at least 10 times greater than the second peak doping concentration and at least 10 times greater than the fourth peak doping concentration; a conductive control gate adjacent to the second, third, and fourth semiconductor layers; and a tunnel dielectric between the conductive control gate and the second, third, and fourth semiconductor layers.

One embodiment includes a non-volatile storage system, comprising a semiconductor substrate having a major surface; a three dimensional memory array of memory cells above the semiconductor substrate; a plurality of word lines coupled to the memory cells; a plurality of global bit lines; a plurality of vertically oriented bit lines electrically connected to the memory cells; and a plurality of vertically oriented thin film transistor (TFT) select devices that are above the semiconductor substrate, wherein the vertically oriented TFT select devices reside between the vertically oriented bit lines and the global bit lines. Each of the vertically oriented TFT select devices comprises a source having a first type of conductivity, wherein the source is electrically connected to a first of the global bit lines; a drain having the first type of conductivity, wherein the drain is electrically connected to a first of the vertical bit lines; a body between the source and the drain, wherein the body comprises a first region having a second type of conductivity that is opposite first type of conductivity, a second region having the first type of conductivity, and a third region having the second type of conductivity, wherein the second region is between the first region and the third region, wherein a peak doping concentration of the second region is greater than a peak doping concentration of the first region and is greater than a peak doping concentration of the third region, wherein the source, the body, and the drain are aligned with each other vertically with respect to the major surface of the substrate; and a control gate adjacent to the body.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

What is claimed is:
1. A semiconductor device, comprising:
a substrate having a major surface;
a first conductive region;
a second conductive region;
a thin film transistor comprising:
i) a first source/drain having a first type of conductivity, wherein the first source/drain is electrically connected to the first conductive region;
ii) a second source/drain having the first type of conductivity, wherein the second source/drain is electrically connected to the second conductive region;
iii) a body between the first source/drain and the second source/drain, wherein the body comprises a first body region having a second type of conductivity that is opposite first type of conductivity, a second body region having the first type of conductivity, and a third body region having the second type of conductivity, wherein the second body region is between the first body region and the third body region, wherein the second body region has a thickness as measured between the first body region and the third body region in the range between 50 to 120 nanometers, wherein a peak doping concentration of the second body region is greater than a peak doping concentration of the first body region and is greater than a peak doping concentration of the third body region, wherein the first source/drain, the body, and the second source/drain are aligned with each other vertically with respect to the major surface of the substrate; and;
iv) a control gate adjacent to the body; and
a management circuit coupled to the control gate, wherein the management circuit is configured to apply a first signal to the control gate to electrically connect the first conductive region to the second conductive region and to apply a second signal to the control gate to electrically disconnect the first conductive region from the second conductive region.

2. The semiconductor device of claim 1, wherein the first body region and the third body region are p−, wherein the second body region is n+, wherein the first source/drain is n+and wherein the second source/drain is n+.

3. The semiconductor device of claim 1, wherein the first body region and the third body region are n−, wherein the second body region is p+.

4. The semiconductor device of claim 1, wherein the second conductive region is a bit line that is oriented vertically with respect to the major surface of the substrate, wherein the first conductive region is a global bit line.

5. The semiconductor device of claim 1, further comprising:
a plurality of non-volatile memory cells in a three-dimensional memory array, wherein the second conductive region is electrically connected to the plurality of non-volatile memory cells.

6. A semiconductor device, comprising:
a semiconductor substrate having a major surface that extends in a horizontal plane;
a first conductive line;
a second conductive line that extends in a vertical direction with respect to the horizontal plane;
a thin film transistor comprising:
a) a first semiconductor layer having a first peak doping concentration of a first type of conductivity, wherein the first semiconductor layer is electrically connected to the first conductive line;
b) a second semiconductor layer having a second peak doping concentration of a second type of conductivity that is opposite the first type of conductivity;
c) a third semiconductor layer having a third peak doping concentration of the first type of conductivity, wherein the third semiconductor layer has a thickness of between 50 to 120 nanometers;
d) a fourth semiconductor layer having a fourth peak doping concentration of the second type of conductivity;

e) a fifth semiconductor layer having a fifth peak doping concentration of the first type of conductivity, wherein the fifth semiconductor layer is electrically connected to the second conductive line, wherein the first, second, third, fourth, and fifth semiconductor layers form a stack that extends in the vertical direction, wherein the first, third and fifth peak doping concentrations are each at least 10 times greater than the second peak doping concentration and at least 10 times greater than the fourth peak doping concentration;

f) a conductive control gate adjacent to the second, third, and fourth semiconductor layers; and g) a tunnel dielectric between the conductive control gate and the second, third, and fourth semiconductor layers.

7. The semiconductor device of claim 6, further comprising:
a plurality of word lines; and
a plurality of reversible resistivity memory cells each having a first end in electrical contact with the second conductive line and a second end in electrical contact with one of the word lines.

8. The semiconductor device of claim 6, wherein the first semiconductor layer is n+, the second semiconductor layer is p−, the third semiconductor layer is n+, the fourth semiconductor layer is p−, and the fifth semiconductor layer is n+.

9. The semiconductor device of claim 6, wherein the first, third and fifth peak doping concentrations are each at least 100 times greater than the second peak doping concentration and at least 100 times greater than the fourth peak doping concentration.

10. The semiconductor device of claim 6, wherein the first, third and fifth peak doping concentrations are each at least 1000 times greater than the second peak doping concentration and at least 1000 times greater than the fourth peak doping concentration.

11. A non-volatile storage system, comprising:
a semiconductor substrate having a major surface;
a three dimensional memory array of memory cells above the semiconductor substrate;
a plurality of word lines coupled to the memory cells;
a plurality of global bit lines;
a plurality of vertical bit lines electrically connected to the memory cells, wherein the vertical bit lines are vertically oriented with respect to the major surface of the semiconductor substrate; and
a plurality of vertically oriented thin film transistor (TFT) select devices that are above the semiconductor substrate, wherein the vertically oriented TFT select devices reside between the vertical bit lines and the global bit lines;
each of the vertically oriented TFT select devices comprising:
a source having a first type of conductivity, wherein the source is electrically connected to a first of the global bit lines;
a drain having the first type of conductivity, wherein the drain is electrically connected to a first of the vertical bit lines;
a body between the source and the drain, wherein the body comprises a first region having a second type of conductivity that is opposite first type of conductivity, a second region having the first type of conductivity, and a third region having the second type of conductivity, wherein the second region is between the first region and the third region, wherein a peak doping concentration of the second region is greater than a peak doping concentration of the first region and is greater than a peak doping concentration of the third region, wherein the second body region has a thickness in the range of 50 to 120 nanometers, wherein the source, the body, and the drain are aligned with each other vertically with respect to the major surface of the semiconductor substrate; and
a control gate adjacent to the body.

12. A semiconductor device, comprising:
a substrate having a major surface;
a first conductive region;
a second conductive region;
a thin film transistor comprising:
i) a first source/drain having a first type of conductivity, wherein the first source/drain is electrically connected to the first conductive region;
ii) a second source/drain having the first type of conductivity, wherein the second source/drain is electrically connected to the second conductive region;
iii) a body between the first source/drain and the second source/drain, wherein the body comprises a first body region having a second type of conductivity that is opposite first type of conductivity, a second body region having the first type of conductivity, and a third body region having the second type of conductivity, wherein the second body region is between the first body region and the third body region, wherein the second body region has a thickness as measured from the first body region to the third body region in the range of 50 to 120 nanometers, wherein a peak doping concentration of the second body region is greater than a peak doping concentration of the first body region and is greater than a peak doping concentration of the third body region, wherein the first source/drain, the body, and the second source/drain are aligned with each other vertically with respect to the major surface of the substrate; and
iv) a control gate adjacent to the body; and
means for applying a first signal to the control gate to electrically connect the first conductive region to the second conductive region and to apply a second signal to the control gate to electrically disconnect the first conductive region from the second conductive region.

13. The semiconductor device of claim 1, wherein the second body region has a thickness of approximately 50 nanometers.

14. The semiconductor device of claim 1, wherein the second body region has a thickness as measured from the first body region to the third body region configured to achieve a target breakdown voltage for the thin film transistor.

15. The semiconductor device of claim 14, wherein the peak doping concentration of the second body region is configured to control the breakdown voltage of the thin film transistor.

16. The semiconductor device of claim 1, wherein the thickness of the second body region as measured from the first body region to the third body region is configured to meet a target drain current ($I_D$) versus drain-to-source voltage (Vds) curve for the thin film transistor.

17. The semiconductor device of claim 1, wherein the thickness of the second body region as measured from the first body region to the third body region is configured to meet a target transconductance (gm) versus gate-to-source voltage (Vgs) curve for the thin film transistor.

18. The semiconductor device of claim 1, wherein the second body region has a thickness as measured between the first body region and the third body region of between 50 to 80 nanometers.

19. The semiconductor device of claim 1, wherein the second body region has a thickness as measured between the first body region and the third body region of between 80 to 120 nanometers.

* * * * *

UNITED STATES PATENT AND TRADEMARK OFFICE
CERTIFICATE OF CORRECTION

PATENT NO. : 9,653,617 B2
APPLICATION NO. : 14/723038
DATED : May 16, 2017
INVENTOR(S) : Zhou et al.

It is certified that error appears in the above-identified patent and that said Letters Patent is hereby corrected as shown below:

On the Title Page

Below abstract delete "19 Claims, 29 Drawing sheets" and insert -- 20 Claims, 29 Drawing sheets --.

In the Claims

Column 36, Lines 32-33, Claim 2: After "is" and before "wherein" delete "n+and" and replace with -- n+ and --.

Column 38, Line 66, Claim 17: After "transconductance" and before "versus" delete "(gm)" and replace with -- ($g_m$) --.

Column 39, Line 9, Insert new Claim 20:
-- 20. A method of forming a semiconductor device, comprising:
    forming a first conductive line above a semiconductor substrate having a major surface that extends in a horizontal plane;
    forming a thin film transistor comprising:
    i) forming a first semiconductor layer having a first peak doping concentration of a first type of conductivity, including forming the first semiconductor layer in electrical contact with the first conductive line;
    ii) forming a second semiconductor layer having a second peak doping concentration of a second type of conductivity that is opposite the first type of conductivity;
    iii) forming a third semiconductor layer having a third peak doping concentration of the first type of conductivity, wherein the third semiconductor layer has a thickness of between 50 to 120 nanometers;
    iv) forming a fourth semiconductor layer having a fourth peak doping concentration of the second type of conductivity;
    v) forming a fifth semiconductor layer having a fifth peak doping concentration of the first type of conductivity, wherein the first, second, third, fourth, and fifth semiconductor layers form a Signed and Sealed this
Twenty-fourth Day of April, 2018

Andrei Iancu
*Director of the United States Patent and Trademark Office* stack that extends in the vertical direction, wherein the first, third and fifth peak doping concentrations are each at least 10 times greater than the second peak doping concentration and at least 10 times greater than the fourth peak doping concentration;

vi) forming a tunnel dielectric as a conformal layer on the first, second, third, fourth, and fifth semiconductor layers; and vii) forming a conductive control gate adjacent to the second, third, and fourth semiconductor layers, wherein the tunnel dielectric is between the conductive control gate and the second, third, and fourth semiconductor layers; and forming a second conductive line that extends in a vertical direction with respect to the horizontal plane, including forming the second conductive line in electrical contact with the fifth semiconductor layer. --.